(12) United States Patent
Kikuchi et al.

(10) Patent No.: US 10,816,865 B2
(45) Date of Patent: Oct. 27, 2020

(54) ACTIVE MATRIX SUBSTRATE

(71) Applicant: Sharp Kabushiki Kaisha, Sakai, Osaka (JP)

(72) Inventors: Tetsuo Kikuchi, Sakai (JP); Tohru Daitoh, Sakai (JP); Hajime Imai, Sakai (JP); Toshikatsu Itoh, Sakai (JP); Hisao Ochi, Sakai (JP); Hideki Kitagawa, Sakai (JP); Masahiko Suzuki, Sakai (JP); Teruyuki Ueda, Sakai (JP); Ryosuke Gunji, Sakai (JP); Kengo Hara, Sakai (JP); Setsuji Nishimiya, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 14 days.

(21) Appl. No.: 16/084,570

(22) PCT Filed: Mar. 13, 2017

(86) PCT No.: PCT/JP2017/010006
§ 371 (c)(1),
(2) Date: Sep. 13, 2018

(87) PCT Pub. No.: WO2017/159625
PCT Pub. Date: Sep. 21, 2017

(65) Prior Publication Data
US 2020/0183208 A1     Jun. 11, 2020

(30) Foreign Application Priority Data

Mar. 15, 2016  (JP) ................................ 2016-050858

(51) Int. Cl.
*G02F 1/1368* (2006.01)
*G02F 1/1362* (2006.01)
(Continued)

(52) U.S. Cl.
CPC ...... *G02F 1/1368* (2013.01); *G02F 1/136286* (2013.01); *H01L 27/124* (2013.01);
(Continued)

(58) Field of Classification Search
CPC ............. G02F 1/1368; G02F 1/136286; G02F 2001/13685; G02F 2201/121;
(Continued)

(56) References Cited

U.S. PATENT DOCUMENTS

2008/0024416 A1   1/2008 Onogi et al.
2009/0268145 A1   10/2009 Anjo et al.
(Continued)

FOREIGN PATENT DOCUMENTS

CN      102386236 A    3/2012
JP      2008-032899 A  2/2008
(Continued)

OTHER PUBLICATIONS

Official Communication issued in International Patent Application No. PCT/JP2017/010006, dated May 16, 2017.

*Primary Examiner* — Shan Liu
(74) *Attorney, Agent, or Firm* — Keating & Bennett, LLP

(57) ABSTRACT

Provided is an active matrix substrate provided with a substrate (1), a peripheral circuit that includes a first oxide semiconductor thin-film transistor (TFT) (101), a plurality of second oxide semiconductor TFTs (102) disposed in a display area, and a first inorganic insulating layer (11) covering the plurality of second oxide semiconductor TFTs (102), the first oxide semiconductor TFT (101) having a lower gate electrode (3A), a gate insulating layer (4), an oxide semiconductor (5A) disposed so as to face the lower gate electrode with the gate insulating layer interposed therebetween, a source electrode (7A) and a drain electrode (8A), and an upper gate electrode (BG) disposed on the
(Continued)

oxide semiconductor (5A) with an insulating layer that includes the first inorganic insulating layer (11) interposed therebetween, and furthermore having, on the upper gate electrode (BG), a second inorganic insulating layer (17) covering the first oxide semiconductor TFT (101).

23 Claims, 25 Drawing Sheets

(51) Int. Cl.
*H01L 27/12* (2006.01)
*H01L 29/786* (2006.01)

(52) U.S. Cl.
CPC ...... *H01L 27/1225* (2013.01); *H01L 29/7869* (2013.01); *G02F 2001/13685* (2013.01); *G02F 2201/121* (2013.01); *G02F 2201/123* (2013.01)

(58) Field of Classification Search
CPC .......... G02F 2201/123; G02F 1/13439; G02F 1/1362; G02F 1/136209; G02F 1/136227; G02F 1/1365; G02F 2001/136218; G02F 2001/136222; G02F 2001/136231; G02F 2001/13625; G02F 2001/1635; G02F 2201/122; G02F 2202/10; H01L 27/1225; H01L 27/124; H01L 29/7869; H01L 2021/775; H01L 27/1214; H01L 27/2436; H01L 29/66037; H01L 29/66068; H01L 29/66227; H01L 29/72; H01L 29/786; H01L 2924/1304; H01L 51/0504; H01L 51/0508
USPC ..................................... 349/42–43
See application file for complete search history.

(56) References Cited

U.S. PATENT DOCUMENTS

| | | |
|---|---|---|
| 2009/0323005 A1 | 12/2009 | Ota |
| 2010/0102313 A1* | 4/2010 | Miyairi ............. H01L 21/47635 257/43 |
| 2011/0198483 A1* | 8/2011 | Kurokawa ......... H04N 5/23248 250/214 R |
| 2012/0138922 A1 | 6/2012 | Yamazaki et al. |
| 2012/0280238 A1 | 11/2012 | Kimura |
| 2013/0270563 A1* | 10/2013 | Yamazaki ......... H01L 21/30604 257/57 |
| 2013/0320334 A1 | 12/2013 | Yamazaki et al. |
| 2014/0139775 A1* | 5/2014 | Miyake ................. H01L 27/124 349/46 |
| 2014/0286076 A1 | 9/2014 | Aoki et al. |
| 2014/0367690 A1* | 12/2014 | Kimura ................ G02B 6/0038 257/66 |
| 2014/0374744 A1* | 12/2014 | Matsukura ........... H01L 27/088 257/43 |
| 2015/0030116 A1 | 1/2015 | Horiuchi et al. |
| 2015/0108467 A1 | 4/2015 | Moriguchi et al. |
| 2018/0374955 A1* | 12/2018 | Yoshida .............. H01L 29/7869 |
| 2019/0172843 A1* | 6/2019 | Yoshida .............. G09G 3/3677 |
| 2019/0221590 A1* | 7/2019 | Nishimura .......... H01L 27/1251 |

FOREIGN PATENT DOCUMENTS

| | | |
|---|---|---|
| JP | 2009-265484 A | 11/2009 |
| JP | 2010-008758 A | 1/2010 |
| JP | 2010-192019 A | 9/2010 |
| JP | 2012-134475 A | 7/2012 |
| JP | 2014-007399 A | 1/2014 |
| JP | 2014-103142 A | 6/2014 |
| JP | 2014-209727 A | 11/2014 |
| JP | 2015-092596 A | 5/2015 |
| WO | 2012/086513 A1 | 6/2012 |
| WO | 2013/137069 A1 | 9/2013 |

* cited by examiner

FIG.25
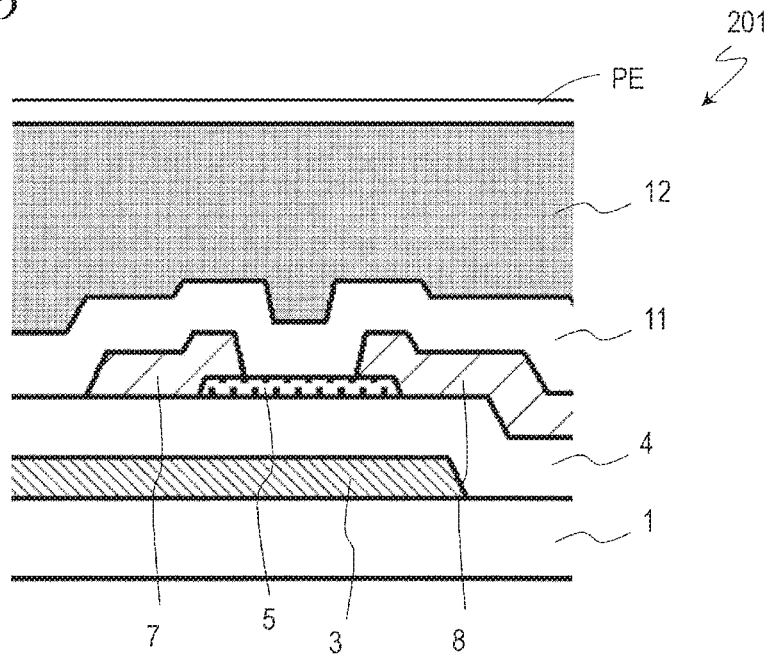
(a)
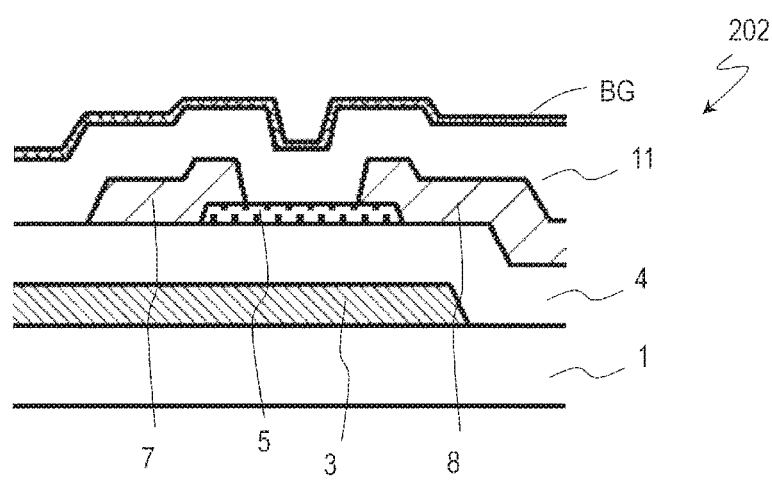
(b)

ACTIVE MATRIX SUBSTRATE

TECHNICAL FIELD

The present invention relates to an active matrix substrate formed using an oxide semiconductor.

BACKGROUND ART

An active matrix substrate used in a liquid crystal display apparatus or the like includes a switching element such as a thin film transistor (hereinafter, referred to as a "TFT") in each of pixels. As such a switching element, a TFT including an amorphous silicon film as an active layer (hereinafter, referred to as an "amorphous silicon TFT") or a TFT including a polycrystalline silicon film as an active layer (hereinafter, referred to as a "polycrystalline silicon TFT") is widely used conventionally.

Recently, it has been proposed to use, as a material of an active layer of a TFT, an oxide semiconductor instead of amorphous silicon or polycrystalline silicon. Such a TFT is referred to as an "oxide semiconductor TFT". An oxide semiconductor has a mobility higher than that of amorphous silicon. Therefore, an oxide semiconductor TFT is operable at a higher speed than an amorphous silicon TFT.

Meanwhile, a technology of providing a driving circuit such as a gate driver, a source driver or the like on a substrate in a monolithic manner (integrally) is known. Such a driving circuit (monolithic driver) is usually formed using a TFT. Recently, a technology of producing a monolithic driver on a substrate using an oxide semiconductor TFT is used. With such a technology, the frame region is narrowed and the mounting process is simplified, and as a result, the cost is decreased.

A TFT included in a driving circuit (hereinafter, referred to as a "circuit TFT") is generally produced in a step of producing a TFT to be located as a switching element in each of pixels (hereinafter, such a TFT will be referred to as a "pixel TFT"), namely, produced at the same time as the pixel TFT. Therefore, the circuit TFT and the pixel TFT are often formed of the same oxide semiconductor film and have the same structure as, or similar structures to, each other. However, the pixel TFT and the circuit TFT are required to have different characteristics from each other, and it is difficult to form an oxide semiconductor TFT having both of the characteristics.

In such a situation, it has been proposed to form a circuit TFT and a pixel TFT of different structures from each other. For example, Patent Document No. 1 discloses a structure in which a back-gate electrode is provided in a circuit TFT for the purpose of controlling the threshold voltage whereas no back-gate electrode is provided in a pixel TFT. The "back-gate electrode" is an additional gate electrode located to face a main gate electrode with a semiconductor layer being located between the back-gate electrode and the main gate electrode. In this specification, a TFT including a back-gate electrode may be referred to as a "back-gate structure TFT".

FIG. 25 provides cross-sectional views respectively showing two types of TFTs 201 and 202 disclosed in Patent Document No. 1. The TFT 201 is a pixel TFT, and the TFT 202 is a circuit TFT. These TFTs 201 and 202 are supported on a substrate 1, and each include a gate electrode 3, an oxide semiconductor layer 5 located on the gate electrode 3 with a gate insulating film 4 being located between the oxide semiconductor layer 5 and the gate electrode 3, and a source electrode 7 and a drain electrode 8 connected with the oxide semiconductor layer 5. The pixel TFT 1 is covered with a passivation layer (first inorganic insulating layer) 11 and an organic insulating layer 12. The drain electrode 8 of the pixel TFT 201 is electrically connected with a pixel electrode PE located on the organic insulating layer 12. The circuit TFT 202 includes a back-gate electrode BG located on the first inorganic insulating layer 11 so as to overlap the oxide semiconductor layer 5. The organic insulating layer 12 is not provided between the first inorganic insulating layer 11 and the back-gate electrode BG. If the organic insulating layer 12, which is relatively thick, is provided between the oxide semiconductor layer 5 and the back-gate electrode BG, the back-gate electrode BG may not be capable of appropriately controlling the threshold voltage of the back-gate structure TFT 202.

In the structure shown in FIG. 25, a layer containing oxygen (e.g., an oxide layer formed of $SiO_2$ or the like) is preferably usable for the first inorganic insulating layer 11 in contact with the oxide semiconductor layer 5. With such a structure, even if oxygen deficiency occurs to the oxide semiconductor layer, the oxide semiconductor layer is recovered from the oxygen deficiency by the oxygen contained in the oxide layer.

CITATION LIST

Patent Literature

Patent Document No. 1: Japanese Laid-Open Patent Publication No. 2015-92596

SUMMARY OF INVENTION

Technical Problem

Regarding an oxide semiconductor TFT, it is known that if reducing gas (e.g., hydrogen gas) contacts the oxide semiconductor layer during the production process of the TFT, oxygen deficiency occurs and thus the characteristics of the TFT are changed. It is also known that even after the production of the oxide semiconductor TFT, the characteristics of the TFT are changed if hydrogen or moisture invades the oxide semiconductor layer from outside. Specifically, if an n-type oxide semiconductor layer is reduced by the invasion of moisture or the like, the threshold voltage Vth is shifted to the negative side, and as a result, an off-leak current may be increased or a depletion state (normally-on state) may occur.

As a result of studies made by the present inventors, it has been found that especially in a circuit TFT, the amount of hydrogen or moisture invading the oxide semiconductor layer needs to be further decreased to suppress the occurrence of the depletion state. In a pixel TFT, even if the threshold voltage is shifted to the negative side, there is no problem as long as the off-leak current is sufficiently small when the gate voltage Vg is at a Low potential VGL (e.g., −6 V). By contrast, in a circuit TFT included in a peripheral circuit such as, for example, a gate driver, if an off-leak current flows even slightly due to the depletion at the gate voltage Vg=0 V, an operation abnormality may occur to the circuit.

As a result of further studies made by the present inventors based on the above-described knowledge, it has been found that in the circuit TFT 201 disclosed in Patent Document No. 1, it may be difficult to sufficiently suppress the invasion of moisture or the like into the oxide semiconductor layer 5 of the circuit TFT 201 from an area above the back-gate electrode BG. The oxide semiconductor layer 5 is covered with the inorganic insulating layer (preferably, silicon oxide film) 11, but the moisture-preventive effect of the silicon oxide film is relatively small. Therefore, it may be difficult to sufficiently suppress the TFT from being put into a depletion state due to the invasion of moisture.

An embodiment of the present invention made in light of the above-described situation has an object of providing an active matrix substrate, including an oxide semiconductor TFT as each of a circuit TFT and a pixel TFT, that is capable of controlling the characteristics of each of the oxide semiconductor TFTs in accordance with the use thereof and is capable of suppressing the characteristics of the circuit TFT from being deteriorated due to moisture or hydrogen.

Solution to Problem

An active matrix substrate according to an embodiment of the present invention is an active matrix substrate including a display region including a plurality of pixels and a non-display region provided around the display region. The active matrix substrate includes a substrate; a first oxide semiconductor TFT supported by the substrate and provided in the non-display region; a peripheral circuit including the first oxide semiconductor TFT; a plurality of second oxide semiconductor TFTs supported by the substrate and provided in the display region; and a first inorganic insulating layer covering the plurality of second oxide semiconductor TFTs. The first oxide semiconductor TFT includes a lower gate electrode, a gate insulating layer covering the lower gate electrode, an oxide semiconductor layer located to face the lower gate electrode with the gate insulating layer being located between the oxide semiconductor layer and the lower gate electrode, a source electrode and a drain electrode each connected with the oxide semiconductor layer, and an upper gate electrode provided on the oxide semiconductor layer with an insulating layer including the first inorganic insulating layer being located between the upper gate electrode and the oxide semiconductor layer. The active matrix substrate further includes a second inorganic insulating layer provided on the upper gate electrode, the second inorganic insulating layer covering the first oxide semiconductor TFT.

In an embodiment, the active matrix substrate further includes an organic insulating layer located between the first inorganic insulating layer and the second inorganic insulating layer. The organic insulating layer has an opening located to overlap at least a part of the oxide semiconductor layer of the first oxide semiconductor TFT as seen in a direction normal to the substrate, and at least a part of the upper gate electrode is located in the opening of the organic insulating layer.

In an embodiment, the active matrix substrate further includes a transparent conductive layer located on the second inorganic insulating layer so as to overlap the upper gate electrode with the second inorganic insulating layer being located between the transparent conductive layer and the upper gate electrode.

In an embodiment, the transparent conductive layer covers at least a part of the peripheral circuit.

In an embodiment, the active matrix substrate further includes a lower transparent electrode provided on the first inorganic insulating layer in the display region, and an upper transparent electrode located on the lower transparent electrode with the second inorganic insulating layer being located between the upper transparent electrode and the lower transparent electrode. The upper gate electrode is formed of a same transparent conductive film as the lower transparent electrode, and the transparent conductive layer is formed of a same transparent conductive film as the upper transparent electrode.

In an embodiment, one of the lower transparent electrode and the upper transparent electrode is a pixel electrode, and the other of the lower transparent electrode and the upper transparent electrode is a common electrode.

In an embodiment, the active matrix substrate further includes a lower transparent electrode provided on the first inorganic insulating layer in the display region, an upper transparent electrode located on the lower transparent electrode with the second inorganic insulating layer being located between the upper transparent electrode and the lower transparent electrode, and another line located between the first inorganic insulating layer and the upper transparent electrode. One of the lower transparent electrode and the upper transparent electrode is a pixel electrode, the other of the lower transparent electrode and the upper transparent electrode is a common electrode, and the another line is not electrically connected with the pixel electrode or the common electrode.

In an embodiment, the upper gate electrode is formed of a same conductive film as the another line.

In an embodiment, the upper gate electrode has a stack structure including a lower layer formed of a same transparent conductive film as the lower transparent electrode and an upper layer formed of a same conductive film as the another line.

In an embodiment, the active matrix substrate further includes a third inorganic insulating layer provided on the upper gate electrode, the third inorganic insulating layer covering the first oxide semiconductor TFT.

In an embodiment, the transparent conductive layer is electrically connected with the common electrode.

In an embodiment, the active matrix substrate further includes an upper gate contact portion electrically connecting the upper gate electrode and the source electrode or the drain electrode of the first oxide semiconductor TFT to each other.

In an embodiment, the active matrix substrate further includes an upper gate contact portion electrically connecting the upper gate electrode and the lower gate electrode to each other.

In an embodiment, the active matrix substrate further includes an upper gate contact portion electrically connecting the upper gate electrode and the common electrode to each other.

In an embodiment, the active matrix substrate further includes an upper gate contact portion electrically connecting the upper gate electrode and the source electrode of the first oxide semiconductor TFT to each other, and a connection portion formed of a same transparent conductive film as the upper transparent electrode. In the upper gate contact portion, the upper gate electrode and the source electrode are connected to each other via the connection portion.

In an embodiment, as seen in a direction normal to the substrate, an outer edge of the oxide semiconductor layer is located inside an outer edge of the upper gate electrode, and a distance between the outer edge of the oxide semiconductor layer and the outer edge of the upper gate electrode is 1 μm or longer.

In an embodiment, as seen in a direction normal to the substrate, an outer edge of the upper gate electrode is located inside an outer edge of the transparent conductive layer, and a distance between the outer edge of the upper gate electrode and the outer edge of the transparent conductive layer is 1 μm or longer.

In an embodiment, the second inorganic insulating layer includes a silicon nitride layer.

In an embodiment, the first inorganic insulating layer includes a silicon oxide layer.

In an embodiment, the peripheral circuit includes a gate driver.

In an embodiment, the first oxide semiconductor TFT and the plurality of second oxide semiconductor TFTs are each an etch-stop TFT.

In an embodiment, the first oxide semiconductor TFT and the plurality of second oxide semiconductor TFTs are each a channel-etch TFT.

In an embodiment, the oxide semiconductor layer contains an In—Ga—Zn—O-based semiconductor.

In an embodiment, the In—Ga—Zn—O-based semiconductor includes a crystalline portion.

In an embodiment, the oxide semiconductor layer has a stack structure.

Advantageous Effects of Invention

According to an embodiment of the present invention, in an active matrix substrate including an oxide semiconductor TFT as each of a circuit TFT and a pixel TFT, the characteristics of each of the oxide semiconductor TFTs are controllable in accordance with the use thereof, and the characteristics of the circuit TFT are suppressed from being deteriorated due to the invasion of moisture or hydrogen into the oxide semiconductor layer.

BRIEF DESCRIPTION OF DRAWINGS

FIG. 6(a) is a cross-sectional view showing the first TFT 101 in modification 3 as an example, and FIG. 6(b) is a plan view showing perimeters of the oxide semiconductor layer 5A, the back-gate electrode BG and the shield layer 30.

FIG. 25(a) and FIG. 25(b) are cross-sectional views respectively showing two types of TFTs 201 and 202 disclosed in Patent Document No. 1.

DESCRIPTION OF EMBODIMENTS

An active matrix substrate according to an embodiment of the present invention includes a pixel TFT located as a switching element in each of pixels and circuit TFTs included in peripheral circuits. The pixel TFT and the circuit TFTs are provided on the same substrate. At least one of the circuit TFTs is an oxide semiconductor TFT having a back-gate structure (hereinafter, this TFT will be referred to as a "first TFT"). The pixel TFT is an oxide semiconductor TFT that is formed on the same substrate as the first TFT and includes no back-gate electrode (hereinafter, this TFT will be referred to as a "second TFT"). The first and second TFTs may be formed of the same oxide semiconductor film as each other. The active matrix substrate according to this embodiment may further include an oxide semiconductor TFT other than the first and second TFTs.

Figure 1:
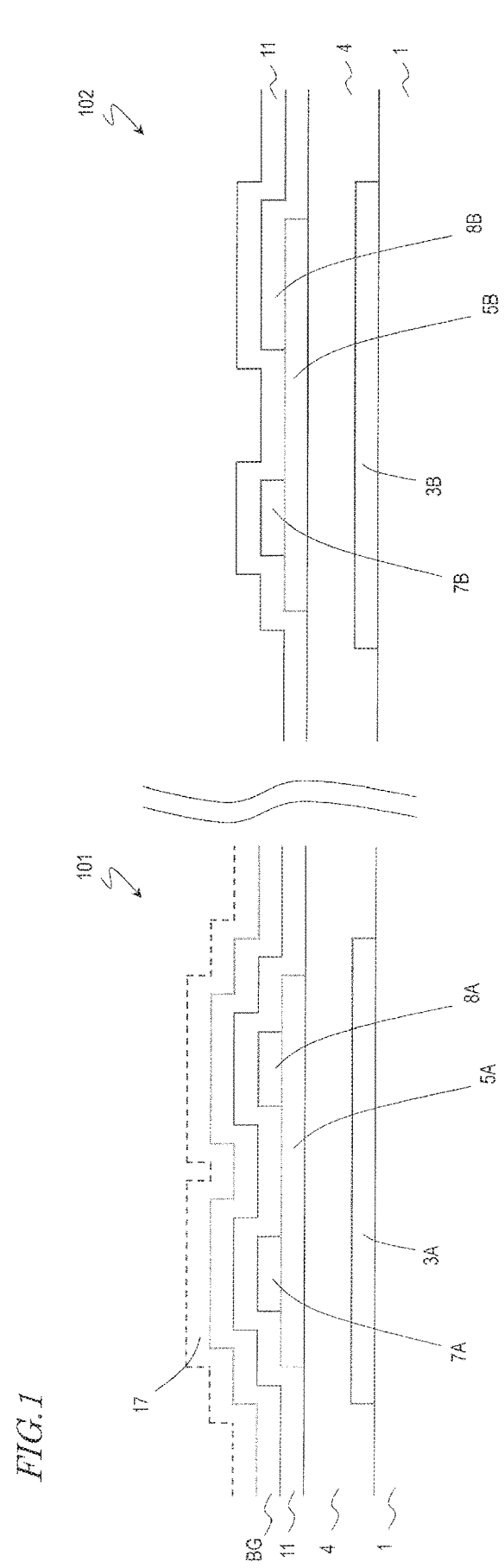
FIG. 1 is a schematic cross-sectional view showing an example of a first TFT 101 and a second TFT 102 in an active matrix substrate according to an embodiment of the present invention.

FIG. 1 is a cross-sectional view showing a first TFT having a back-gate structure and a second TFT with no back-gate structure as examples. The TFTs 101 and 102 are supported on the same substrate 1. In this example, the TFT 102 is a bottom-gate TFT and is covered with a first inorganic insulating layer 11 (passivation film).

The first TFT 101 includes a main gate electrode (hereinafter, referred to simply as the "gate electrode") 3A supported on the substrate 1, a gate insulating layer 4 covering the gate electrode 3A, an oxide semiconductor layer 5A formed on the gate insulating layer 4 and acting as an active layer, a source electrode 7A, a drain electrode 8A, and a back-gate electrode BG located on the oxide semiconductor layer 5A with an inorganic insulating layer including the first inorganic insulating layer 11 being located between the back-gate electrode BG and the oxide semiconductor layer 5A. The oxide semiconductor layer 5A is located to face the main gate electrode 3A with the gate insulating layer 4 being located between the oxide semiconductor layer 5A and the main gate electrode 3A, and also to face the back-gate electrode BG with the first inorganic insulating layer 11 being located between the oxide semiconductor layer 5A and the back-gate electrode BG. A second inorganic insulating layer 17 is located on the back-gate electrode BG so as to cover the first TFT 101.

In this specification, among the main gate electrode and the back-gate electrode of the back-gate structure TFT, an electrode that is located on the substrate side with respect to the oxide semiconductor layer may be referred to as a "lower gate electrode", and an electrode located on the oxide semiconductor layer may be referred to as an "upper gate electrode". One of the upper electrode and the lower electrode acts as the "main gate electrode", and the other electrode acts as the "back-gate electrode", which is additional. In the example shown in the figure, the upper gate electrode is the back-gate electrode BG and the lower gate electrode is the main gate electrode 3A.

The source electrode 7A and the drain electrode 8A are electrically connected with the oxide semiconductor layer 5A. A region of the oxide semiconductor layer 5A that is in contact with the source electrode 7A is referred to as a "source contact region", and a region of the oxide semiconductor layer 5A that is in contact with the drain electrode 8A is referred to as a "drain contact region". A region of the oxide semiconductor layer 5A that is located between the source contact region and the drain contact region and overlaps the gate electrode 3A with the gate insulating layer 4 being located therebetween is a channel region.

The back-gate electrode BG is located on the oxide semiconductor layer 5A with the first inorganic insulating layer 11 being located between the back-gate electrode BG and the oxide semiconductor layer 5A. The first inorganic insulating layer 11 is a protective film (passivation film) covering the second TFT 102. The back-gate electrode BG is located to overlap at least a part of the channel region of the oxide semiconductor layer 5A as seen in a direction normal to the substrate.

In this example, the back-gate electrode BG is located to contact a top surface of the first inorganic insulating layer 11 and also to overlap the entirety of the oxide semiconductor layer 5A as seen in the direction normal to the substrate. Between the oxide semiconductor layer 5A and the back-gate electrode BG, only the first inorganic insulating layer 11 is located. Alternatively, another inorganic insulating layer (e.g., etch-stop layer described below) may further be located between the oxide semiconductor layer 5A and the back-gate electrode BG. An insulating layer located between the oxide semiconductor layer 5A and the back-gate electrode BG acts as an upper gate insulating layer.

The back-gate electrode BG may be electrically connected with the source electrode 7A or the drain electrode 8A of the first TFT 101, or may be electrically connected with the gate electrode 3A. Alternatively, the back-gate electrode BG may be electrically connected with a common electrode and set to have a common potential. Still alternatively, the back-gate electrode BG may be set to have a negative-side power supply potential VSS or may be connected with another, independent power supply.

Figure 5:
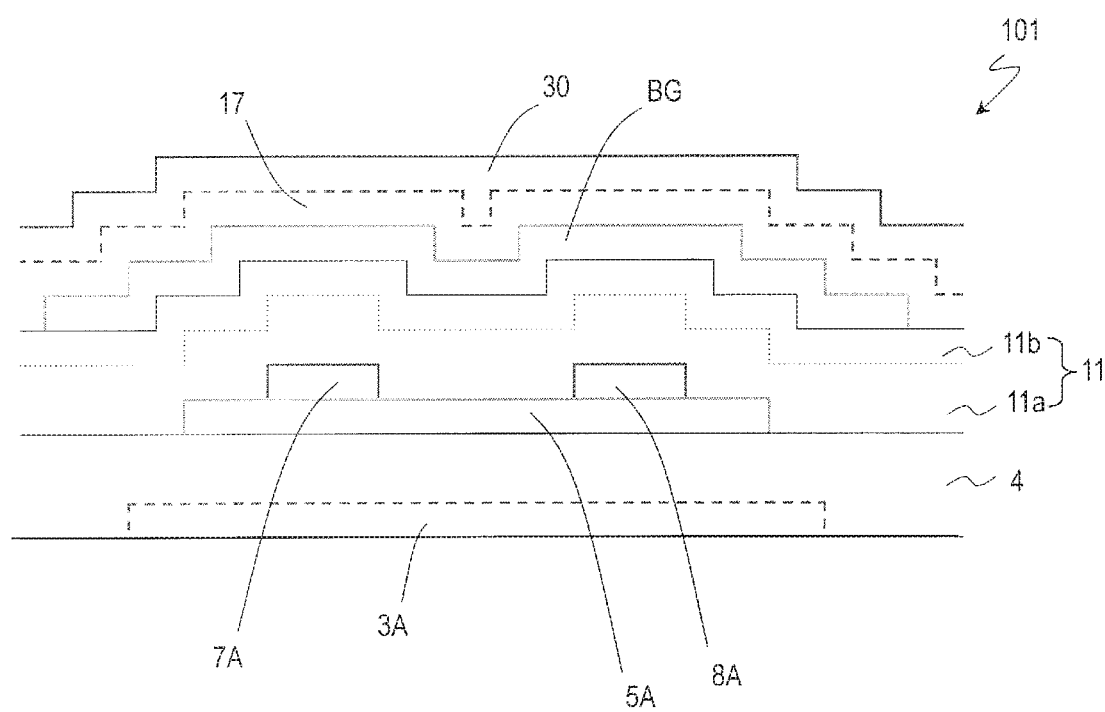
FIG. 5 is a schematic cross-sectional view showing another TFT structure as an example.

Preferably, the first inorganic insulating layer 11 includes an oxide film in order to alleviate the oxygen deficiency occurring in the oxide semiconductor layer 5A or an oxide semiconductor layer 5B. The first inorganic insulating layer 11 may be, for example, an oxide film of silicon oxide or the like or a stack film including a silicon oxide layer and a silicon nitride layer stacked in this order (see FIG. 5). The first inorganic insulating layer 11 has a thickness of, for example, 100 nm or greater and 500 nm or less. The second inorganic insulating layer 17 is, for example, a silicon nitride layer (thickness: e.g., 70 nm or greater and 300 nm or less).

The second TFT 102 has substantially the same structure as that of the first TFT 101, but includes no back-gate electrode. The second TFT 102 includes a gate electrode 3B supported on the substrate 1, the gate insulating layer 4 covering the gate electrode 3B, an oxide semiconductor layer 5B formed on the gate insulating layer 4 and acting as an active layer, a source electrode 7B, and a drain electrode 8B. The source electrode 7B and the drain electrode 8B are electrically connected with the oxide semiconductor layer 5B. The gate electrode 3B is electrically connected with a gate line described below, and the source electrode 7B is electrically connected with a source line described below. The drain electrode 8B is electrically connected with a pixel electrode not shown. From the point of view of simplifying the production process, it is preferred that the gate electrode 3B, the oxide semiconductor layer 5B, the source electrode 7B and the drain electrode 8B are respectively formed in the same layers as the gate electrode 3A, the oxide semiconductor layer 5A, the source electrode 7A and the drain electrode 8A of the first TFT 101.

The second TFT 102 merely needs to be covered with the first inorganic insulating layer 11, and is not limited to having the TFT structure shown in the figure. The second TFT 102 may have a TFT structure different from that of the first TFT 101.

According to this embodiment, the oxide semiconductor layer 5A of the first TFT 101 is covered with the second inorganic insulating layer 17 located on the back-gate electrode BG in addition to with the first inorganic insulating layer 11 and the back-gate electrode BG. Therefore, the invasion of moisture into the oxide semiconductor layer 5A is alleviated, and thus deterioration of the TFT characteristics due to the moisture is suppressed.

As described above, it is undesirably possible that the invasion of moisture into the oxide semiconductor layer 5A is not suppressed merely by the first inorganic insulating layer 11. It is preferred to use a silicon oxide layer as the first inorganic insulating layer 11, but silicon oxide is poor in moisture resistance. A stack film including a silicon oxide layer and a silicon nitride layer may be used as the first inorganic insulating layer 11. In this case, since a silicon nitride layer has a high moisture resistance, a higher moisture-preventive effect is provided than in the case where the first inorganic insulating layer 11 has a single-layer film structure formed of a silicon oxide layer. However, it is difficult to form the silicon nitride layer of the first inorganic insulating layer 11 to be sufficiently thick, and the thickness of the silicon nitride layer is suppressed to, for example, 100 nm or less. A reason for this is that if the silicon nitride layer is too thick, the oxide semiconductor may undesirably be reduced by hydrogen generated by the formation of the silicon nitride layer. Therefore, even if the stack film is used as the first inorganic insulating layer 11, it may not be guaranteed that the invasion of moisture into the oxide semiconductor layer 5A is suppressed sufficiently. By contrast, in this embodiment, the oxide semiconductor layer 5A is covered with the second inorganic insulating layer 17 in addition to with the first inorganic insulating layer 11. The second inorganic insulating layer 17 may include a nitride film such as, for example, a silicon nitride layer. The back-gate electrode BG is located between the second inorganic insulating layer 17 and the oxide semiconductor layer 5A. Therefore, even in the case where the silicon nitride layer is formed as the second inorganic insulating layer 17, the back-gate electrode BG blocks the invasion of hydrogen, desorbed from the second inorganic insulating layer 17, into the oxide semiconductor layer 5A. Therefore, a silicon nitride layer having a sufficient thickness (e.g., exceeding 100 nm) is allowed to be formed as the second inorganic insulating layer 17. Thus, the first TFT 101 is more suppressed from being put into a depletion state due to the invasion of moisture than by a conventional structure.

<Modifications>

Figure 2:
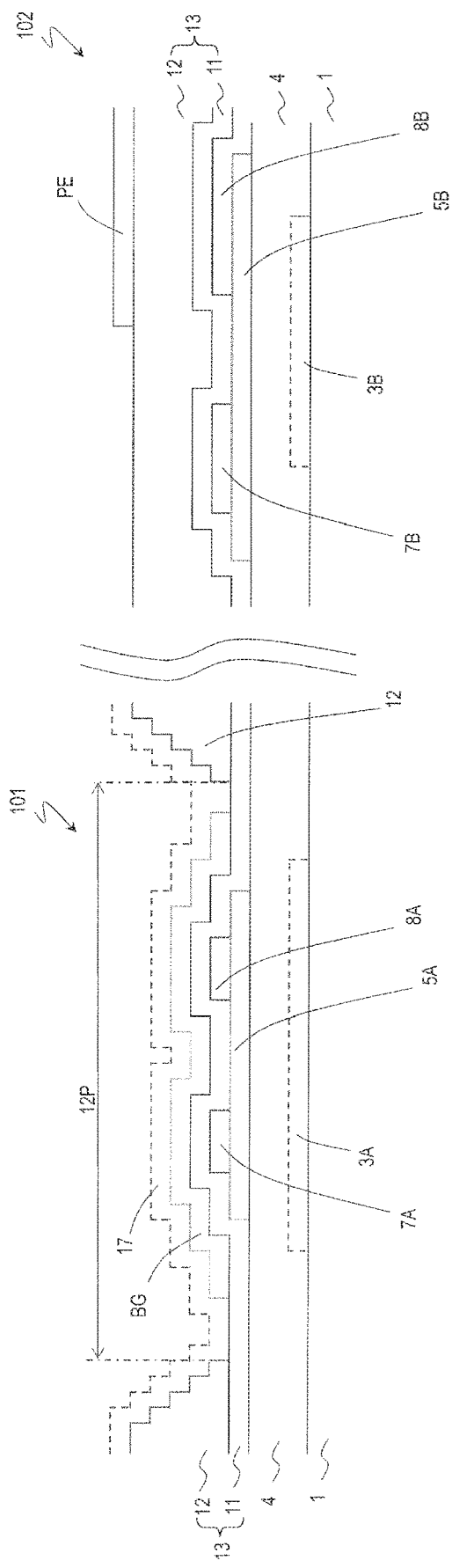
FIG. 2 is a schematic cross-sectional view showing the first TFT 101 and the second TFT 102 in modification 1.
Figure 3:
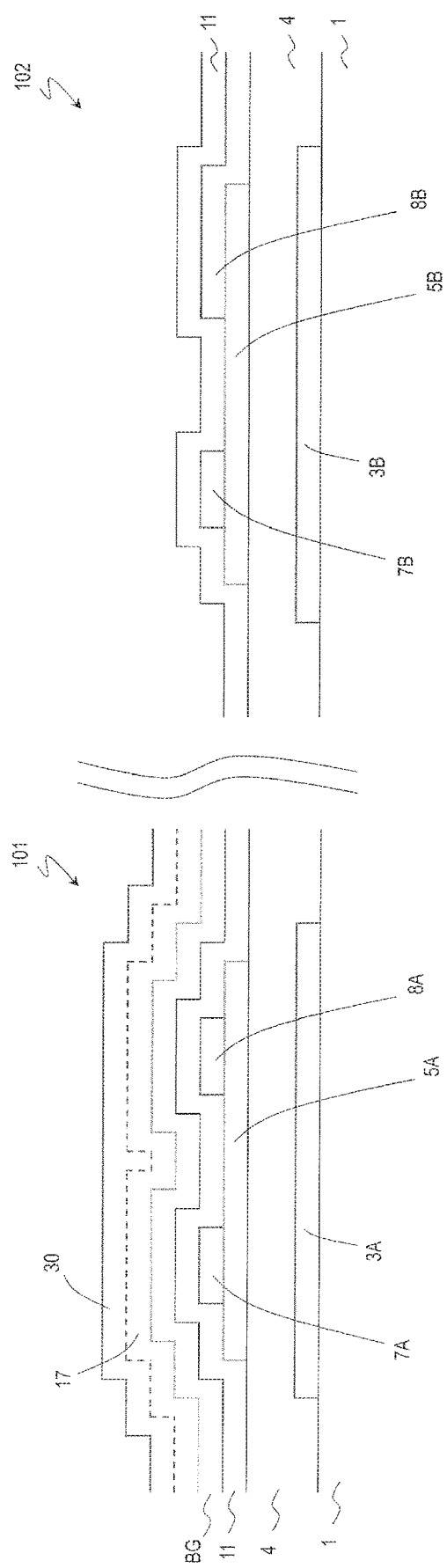
FIG. 3 is a schematic cross-sectional view showing the first TFT 101 and the second TFT 102 in modification 2.
Figure 4:
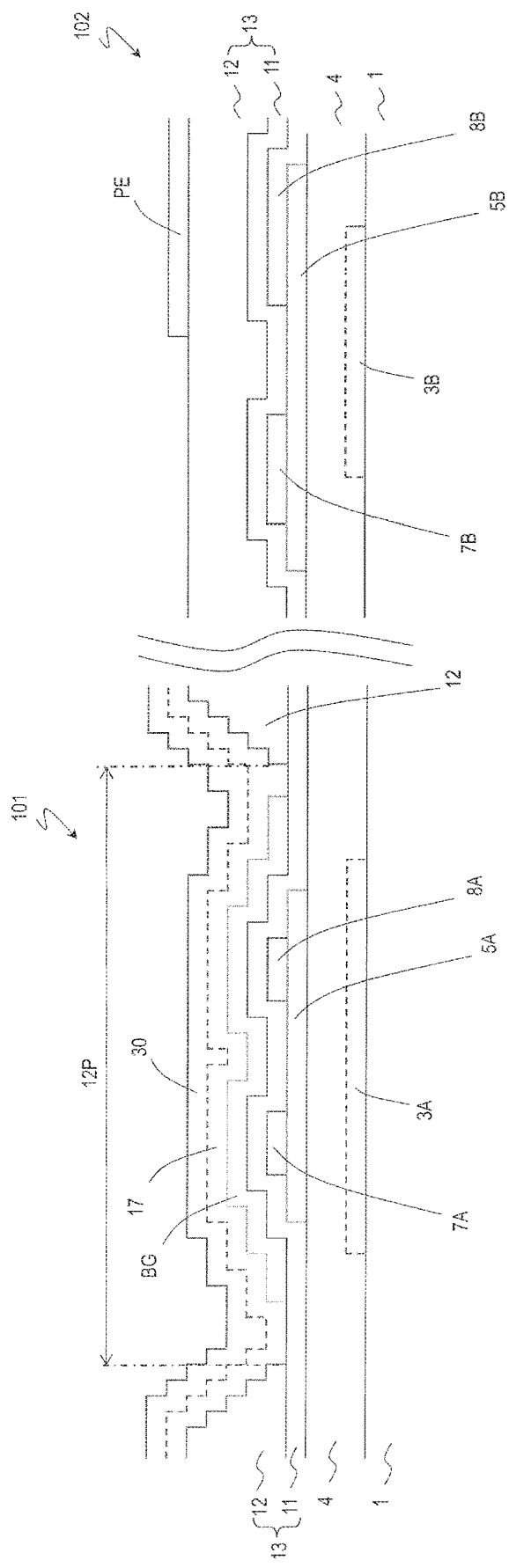
FIG. 4 is a schematic cross-sectional view showing the first TFT 101 and the second TFT 102 in modification 3.

FIG. 2 through FIG. 4 respectively provide schematic cross-sectional views of the first TFT 101 and the second TFT 102 in modifications 1 through 3. In FIG. 2 through FIG. 4, elements substantially the same as those in FIG. 2 bear the identical reference signs thereto. In the following, only differences from FIG. 1 will be described.

In modification 1 shown in FIG. 2, an organic insulating layer 12 is provided between the first inorganic insulating layer 11 and the second inorganic insulating layer 17. The organic insulating layer 12 is thicker than the first inorganic insulating layer 11, and has a thickness of, for example, 1 µm or greater and 3 µm or less. The organic insulating layer 12 is used to, for example, flatten a top surface of the second TFT 102 as the pixel electrode or decrease the static capacitance formed between the pixel electrode PE and the source line or the like.

In a display region, the second TFT 102 is covered with the first inorganic insulating layer 11 and the organic insulating layer 12. The first inorganic insulating layer 11 and the organic insulating layer 12 will be collectively referred to as an "interlayer insulating layer 13". On the interlayer insulating layer 13, the pixel electrode PE is formed. The pixel electrode PE is connected with the drain electrode 8B of the second TFT 102 in a contact hole (not shown) formed in the interlayer insulating layer 13.

In a non-display region, the organic insulating layer 12 has an opening 12P above the first TFT 101. The opening 12P is located to overlap at least the channel region of the first TFT 101 as seen in the direction normal to the substrate 1. The opening 12P may be located to overlap the entirety of the oxide semiconductor layer 5A. At least a part of the back-gate electrode BG is located to contact the first inorganic insulating layer 11 in the opening 12P. The second inorganic insulating layer 17 is formed on the organic insulating layer 12 and the back-gate electrode BG. In this example, the entirety of the back-gate electrode BG is located in the opening 12P. Alternatively, a part of the back-gate electrode BG may be located in the opening 12P and the remaining part of the back-gate electrode BG may be located on a side surface and a top surface of the organic insulating layer 12. As shown in the figure, the second inorganic insulating layer 17 may be in contact with the back-gate electrode BG.

According to modification 1, the organic insulating layer 12 is not located between the back-gate electrode BG and the oxide semiconductor layer 5A. Therefore, the effect provided by the back-gate electrode BG (control on the threshold voltage, etc.) is provided certainly.

In modification 2 shown in FIG. 3, the first TFT 101 is covered with a transparent conductive layer 30 located on the second inorganic insulating layer 17. As seen in the direction normal to the substrate, the transparent conductive layer 30 and the back-gate electrode BG overlap each other at least partially with the second inorganic insulating layer 17 being located between the transparent conductive layer 30 and the back-gate electrode BG. The transparent conductive layer 30 is provided, in addition to the back-gate electrode BG, the first inorganic insulating layer 11 and the second inorganic insulating layer 17, on the oxide semiconductor layer 5A, so that the invasion of humidity (moisture) into the oxide semiconductor layer 5A is alleviated more effectively.

The transparent conductive layer 30 may be a shield layer provided to overlap at least a part of the peripheral circuit including the first TFT 101. The transparent conductive layer (hereinafter, referred to as the "shield layer") 30 is set to have, for example, the common potential. In the case where the back-gate electrode BG is not set to have the common potential (e.g., in the case where the back-gate electrode BG is connected with the gate electrode 3A, the drain electrode 8A or the source electrode 7A), the shield layer 30 set to have the common potential may be provided. In this manner, the display characteristics are suppressed from being deteriorated due to the potential of the back-gate electrode BG charging a counter substrate (color filter substrate) located to face the active matrix substrate.

The problem caused by the counter substrate being charged is described in, for example, Japanese Laid-Open Patent Publication No. 2009-265484. When the counter substrate is charged, the display may undesirably be whitened in a peripheral region of the display region. By contrast, in modification 2, the charge of the counter substrate is alleviated, and therefore, the generation of such whitened display is suppressed.

In modification 3 shown in FIG. 4, the shield layer 30 is provided unlike in modification 1 (FIG. 2). The shield layer 30 is located on the second inorganic insulating layer 17 so as to cover the first TFT 101. As seen in the direction normal to the substrate, the shield layer 30 and the back-gate electrode BG overlap each other at least partially. In this example, the shield layer 30 is located on the organic insulating layer 12 and in the opening 12P, and overlaps the entirety of the back-gate electrode BG as seen in the direction normal to the substrate.

In each of the examples shown in FIG. 1 through FIG. 4, the first inorganic insulating layer 11 may be a stack film. A shown in, for example, FIG. 5, the first inorganic insulating layer 11 may have a stack structure including a silicon oxide layer ($SiO_2$) 11a located on the substrate side and a silicon nitride (SiN) layer 11b located on the silicon oxide layer 11a (on the back-gate BG side). In this example, the silicon oxide layer 11a is located to contact the oxide semiconductor layer 5A. A silicon nitride film has a moisture resistance higher than that of a silicon oxide film. Therefore, in the case where the first inorganic insulating layer 11 has such a stack structure, the invasion of hydrogen into the oxide semiconductor layer 5A from the second inorganic insulating layer 17 is alleviated more effectively than in the case where the first inorganic insulating layer 11 has a single-layer structure formed of a silicon oxide layer.

<Positional Arrangement of the Back-Gate Electrode BG and the Shield Layer 30>

Now, a preferred positional arrangement of the back-gate electrode BG, the oxide semiconductor layer 5A and the shield layer 30 will be described. In this example, modification 3 will be described as an example. The same is applicable to the other examples shown in FIG. 1 through FIG. 4.

FIG. 6(a) is a cross-sectional view showing the first TFT 101 in modification 3 as an example. FIG. 6(b) is a plan view showing perimeters of the oxide semiconductor layer 5A, the back-gate electrode BG and the shield layer 30.

As shown in the figure, it is preferred that the back-gate electrode BG is located to overlap the entirety of the oxide semiconductor layer 5A. Namely, it is preferred that as seen in the direction normal to the substrate, the outer edge of the oxide semiconductor layer 5A is located inside the outer edge of the back-gate electrode BG. In order to cover the oxide semiconductor layer 5A with the back-gate electrode BG more certainly, the oxide semiconductor layer 5A and the back-gate electrode BG may be designed in consideration of the photoalignment precision, the variance in the line widths of the oxide semiconductor layer 5A and the back-gate electrode BG, and the like. More specifically, the oxide semiconductor layer 5A and the back-gate electrode BG may be designed such that, for example, width w2 of the back-gate electrode BG in an arbitrary direction is longer than width w1 of the oxide semiconductor layer 5A in the arbitrary direction by 2 µm or greater, or 6 µm or greater depending on the alignment precision.

Distance d1 between the outer edge of the oxide semiconductor layer 5A and the outer edge of the back-gate electrode BG merely needs to exceed 0 µm. Distance d1 is preferably 1 µm or longer, and more preferably 3 µm or longer. In other words, it is preferred that the shortest distance between the outer edge of the oxide semiconductor layer 5A and the outer edge of the back-gate electrode BG is 1 µm or greater (or 3 µm or greater). With such a structure, the invasion of moisture into the oxide semiconductor layer 5A is suppressed more effectively.

Figure 6:
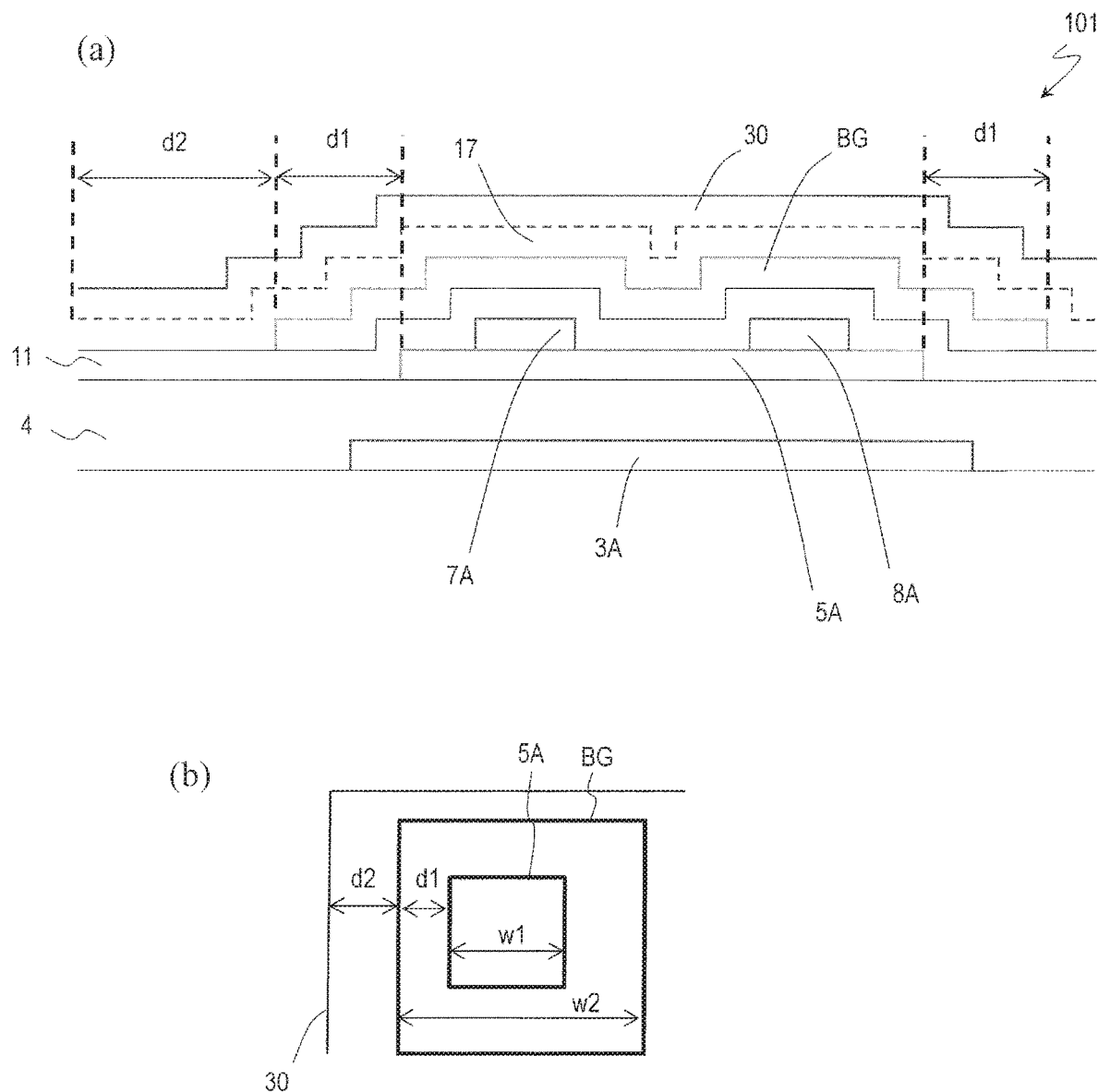
FIG. 6 provides views illustrating the positional relationship among an oxide semiconductor layer 5A, a back-gate electrode BG and a shield layer 30.

Especially in the case where the second inorganic insulating layer 17 is formed after the organic insulating layer 12 is formed (modifications 1 and 3), the second inorganic insulating layer 17 needs to be formed at a temperature lower than in a usual case. Therefore, the second inorganic insulating layer 17 contains a large amount of hydrogen. Hydrogen desorbed from the second inorganic insulating layer 17 may undesirably invade the oxide semiconductor layer 5A, and as a result, the oxide semiconductor may undesirably be reduced to put the first TFT 101 into a depletion state. In the case where as shown in FIG. 6, the oxide semiconductor layer 5A is covered with the back-gate electrode BG and distance d1 is 1 µm or longer, the invasion of hydrogen desorbed from the second inorganic insulating layer 17 is suppressed more effectively.

In the meantime, in the case where the back-gate electrode BG is formed of a transparent conductive film, the adhesiveness between the back-gate electrode BG and the second inorganic insulating layer 17 formed thereon is low, and the second inorganic insulating layer 17 may undesirably be delaminated. Especially in the case where the stress difference between the second inorganic insulating layer 17 and the back-gate electrode BG is large, the second inorganic insulating layer 17 is easily delaminated. In order to suppress such delamination, it is preferred that the shield layer 30 is located to cover the back-gate electrode BG. Namely, it is preferred that as seen in the direction normal to the substrate, the outer edge of the back-gate electrode BG is located inside the outer edge of the shield layer 30. For example, if the back-gate electrode BG has a compression stress and the second inorganic insulating layer 17 has a tensile stress, the back-gate electrode BG and the second inorganic insulating layer 17 are pulled in opposite directions from each other, and are easily delaminated from each other. However, in the case where the shield layer 30 having a compression stress is located on the second inorganic insulating layer 17, the stress of the second inorganic insulating layer 17 is counteracted. Therefore, the stress difference between the second inorganic insulating layer 17 and the back-gate electrode BG is decreased, and the delamination is suppressed.

In order to cover the back-gate electrode BG with the shield layer 30 more certainly, the back-gate electrode BG and the shield layer 30 may be designed in consideration of the photoalignment precision and the variance in the line widths of the back-gate electrode BG and the shield layer 30. More specifically, the shield layer 30 and the back-gate electrode BG may be designed such that, for example, the width of the shield layer 30 in an arbitrary direction is longer than width w2 of the back-gate electrode BG in the arbitrary direction by 2 µm or greater, or 6 µm or greater depending on the alignment precision. Distance d2 between the outer edge of the back-gate electrode BG and the outer edge of the shield layer 30 merely needs to exceed 0 µm. Distance d2 is preferably 1 µm or longer, and more preferably 3 µm or longer. In other words, it is preferred that the shortest distance between the outer edge of the back-gate electrode BG and the outer edge of the shield layer 30 is 1 µm or greater (or 3 µm or greater). With such a structure, the delamination of the second inorganic insulating layer 17 is suppressed more effectively. Distance d2 may be 3 µm or greater.

Embodiment 1

Hereinafter, embodiment 1 of the active matrix substrate according to the present invention will be described with reference to the drawings. The active matrix substrate according to this embodiment is widely applicable to a liquid crystal display apparatus, an organic EL display device, an inorganic EL display device or the like.

Figure 7:
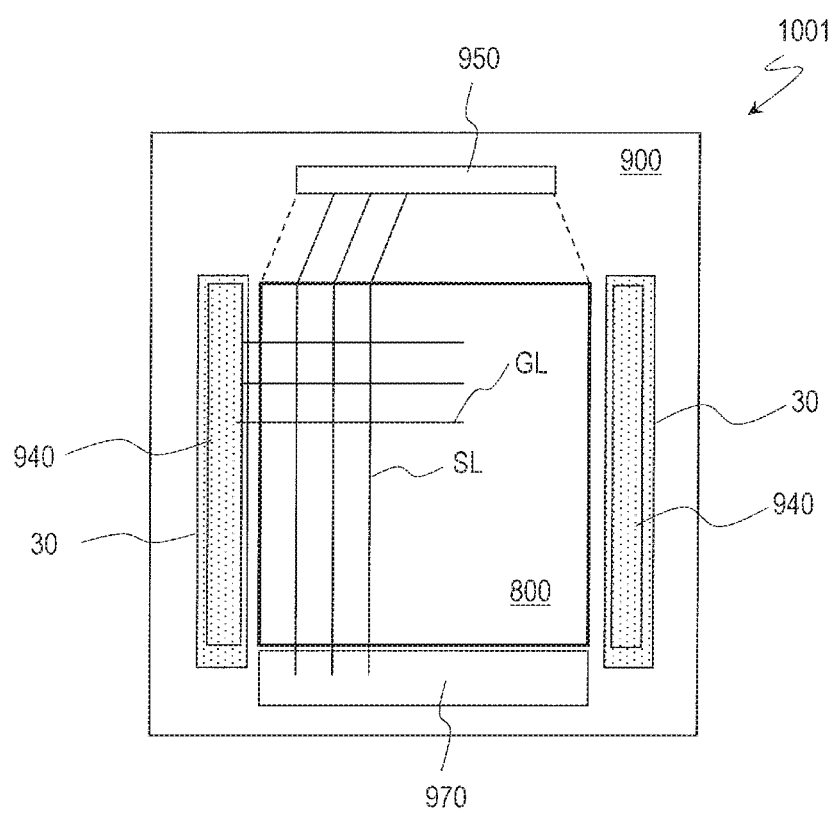
FIG. 7 is a schematic plan view illustrating an overall structure of an active matrix substrate 1001 according to embodiment 1.

FIG. 7 is a schematic plan view illustrating an active matrix substrate 1001 according to this embodiment.

The active matrix substrate 1001 includes a display region 800 including a plurality of pixel regions and a region 900 other than the display regions 800 (non-display region). The "pixel region" is a region corresponding to a pixel in a display device, and in this specification, may be referred to simply as a "pixel".

In the display region 800, a plurality of gate lines GL and a plurality of source lines SL are formed. Each of regions defined by these lines is the "pixel". A plurality of such pixels are located in a matrix. In each of the pixels, a pixel TFT (not shown) is formed in the vicinity of each of intersections of the plurality of source lines SL and the plurality of gate lines GL. In this embodiment, an oxide semiconductor TFT of a bottom-gate structure that includes no back-gate electrode is used as the pixel TFT. A pixel electrode (not shown) is formed in each pixel. The drain electrode of each pixel TFT is electrically connected with the pixel electrode.

In the non-display region 900, circuits such as a gate driver circuit 940, an inspection circuit 970, a source switching circuit 950 and the like; terminals electrically connecting a common line (COM line), the gate lines GL or the source lines SL with external lines; and the like are provided. In the non-display region 900, a circuit TFT is formed as a circuit element of either one of the above-described circuits.

Now, a more specific structure of a part of the display region 800 and a part of the non-display region 900 will be described by way of an active matrix substrate usable for an FFS (Fringe Field Switching) mode display device as an example.

In an active matrix substrate usable in an FFS mode display device, a pixel TFT, a pixel electrode PE and a common electrode CE to be supplied with a common signal are provided in each of the pixel regions in the display region 800. The pixel electrode PE and the common electrode CE are located to partially overlap each other with a dielectric layer (in this example, the second inorganic insulating layer) being located between the pixel electrode PE and the common electrode CE. The pixel electrode PE may be located on the common electrode CE with the dielectric layer being located therebetween. Alternatively, the common electrode CE may be located on the pixel electrode PE with the dielectric layer being located therebetween. In this specification, among the pixel electrode PE and the common electrode CE, an electrode that is located on the substrate side may be referred to as a "lower transparent electrode", and the other electrode may be referred to as an "upper transparent electrode".

In this embodiment, an example in which the lower transparent electrode is the common electrode CE and the upper transparent electrode is the pixel electrode PE will be described. Such an electrode structure is described in, for example, WO2011/086513. The lower transparent electrode may be the pixel electrode PE, and the upper transparent electrode may be the common electrode CE. Such an electrode structure is described in, for example, Japanese Laid-Open Patent Publication No. 2008-032899 and Japanese Laid-Open Patent Publication No. 2010-008758. The entirety of the disclosures of WO2011/086513, Japanese Laid-Open Patent Publication No. 2008-032899 and Japanese Laid-Open Patent Publication No. 2010-008758 are incorporated herein by reference.

Figure 8:
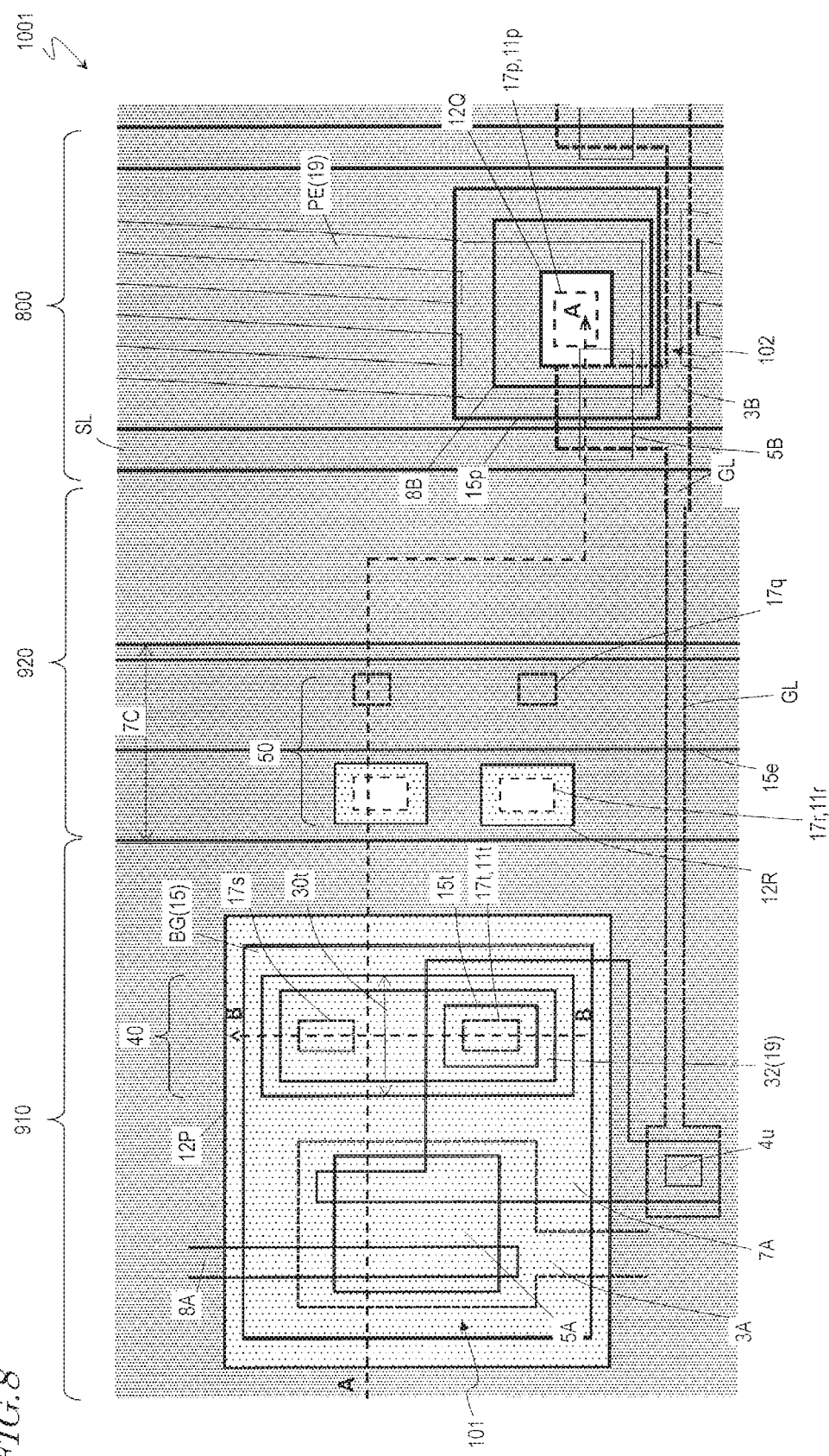
FIG. 8 is a schematic plan view showing the active matrix substrate 1001 according to embodiment 1 as an example.
Figure 9:
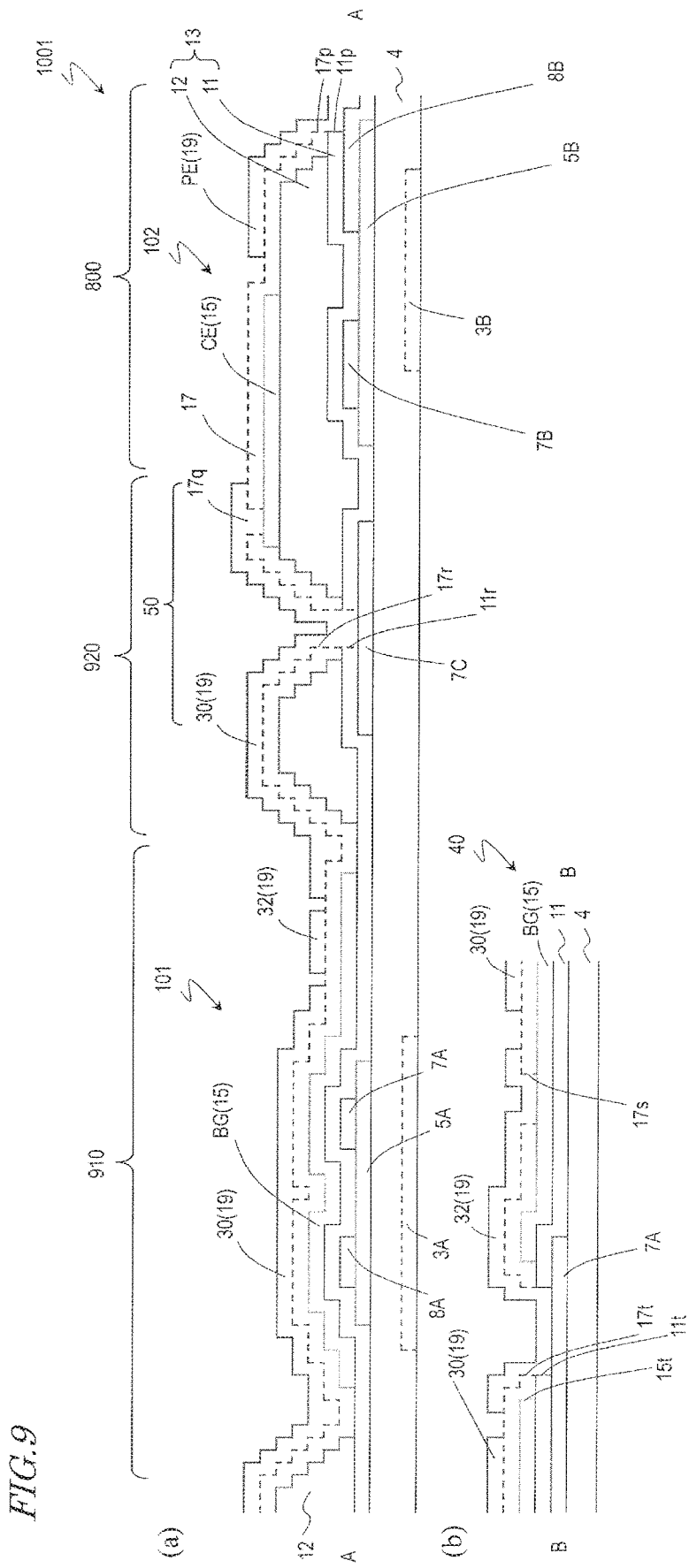
FIG. 9(a) and FIG. 9(b) are each a schematic cross-sectional view of the active matrix substrate 1001.

FIG. 8 is a schematic plan view showing the active matrix substrate 1001 according to this embodiment as an example. FIG. 9(a) and FIG. 9(b) are each a schematic cross-sectional view of the active matrix substrate 1001, and respectively show cross-sectional structures taken along lines A-A and B-B in FIG. 8. FIG. 8 and FIG. 9 each show a circuit region 910 and a COM line region 920 in the non-display region 900 and one pixel region of the display region 800. In the circuit region 910, peripheral circuits are formed. In the COM line region 920, the common line (COM line) is formed. The "pixel region" is a region corresponding to a pixel in the display device. The COM line region 920 is located, for example, between the display region 800 and the circuit region 910 as seen in the direction normal to the substrate. In the following, the same descriptions as those made above with reference to FIG. 1 through FIG. 5 will be omitted appropriately.

In this example, the upper transparent electrode acts as the pixel electrode PE, and the lower transparent electrode acts as the common electrode CE. The back-gate electrode BG is formed of the same transparent conductive film as that of the common electrode CE. The shield layer 30 is formed of the same transparent conductive film as that of the pixel electrode PE.

In this specification, a layer formed of the same transparent conductive film as that of the lower transparent electrode (in this example, the common electrode CE) will be referred to as a "first transparent electrode layer 15", and a layer formed of the same transparent conductive film as that of the upper transparent electrode (in this example, the pixel electrode PE) will be referred to as a "second transparent electrode layer 19". In this example, the first transparent electrode layer 15 includes the common electrode CE and the back-gate electrode BG. The second transparent electrode layer 19 includes the pixel electrode PE and the shield layer 30.

In each of the pixel regions of the display region 800, the second TFT 102 as the pixel TFT, the source line SL, the gate line GL, the interlayer insulating layer 13 covering the source line SL and the gate line GL, the common electrode CE provided on the interlayer insulating layer 13, and the pixel electrode PE located on the common electrode CE with the second inorganic insulating layer 17 being provided between the pixel electrode PE and the common electrode CE are formed.

The second TFT 102 has substantially the same structure as that in modification 3 shown in FIG. 4.

The common electrode CE may be formed in substantially the entirety of the display region without being divided in correspondence with the pixels. The common electrode CE has an opening 15p on the drain electrode 8B of the second TFT 102 in each of the pixel regions. A pixel contact hole described below is formed in the opening 15p. In this example, the common electrode CE covers substantially the entirety of the display region except for regions located on the pixel contact holes.

The pixel electrode PE is provided in each of the pixels. The pixel electrode PE in each pixel has at least one slit or cutout. The pixel electrode PE is electrically connected with the drain electrode 8B of the corresponding second TFT 102 in the pixel contact hole formed in the interlayer insulating layer 13 and the second inorganic insulating layer 17. In this example, as seen in the direction normal to the substrate, the pixel contact hole is located inside the opening 15p. As seen in the direction normal to the substrate, the pixel contact hole includes an opening 12Q formed in the organic insulating layer 12 and openings 11p and 7p formed inside the opening 12Q and formed in the first inorganic insulating layer 11 and the second inorganic insulating layer 17.

In the circuit region 910, a peripheral circuit including the first TFT 101 is formed. The peripheral circuit is, for example, a gate driver. The first TFT 101 may be an output driver of the gate driver. In this example, the first TFT 101 has substantially the same structure as that in modification 3 described above. Namely, the back-gate electrode BG of the first TFT 101 is located in the opening 12P of the organic insulating layer 12. On the back-gate electrode BG, the shield layer 30 is formed with the second inorganic insulating layer 17 being located between the shield layer 30 and the back-gate electrode BG. As described above, in this example, the back-gate electrode BG is formed in the first transparent electrode layer 15, and the shield layer 30 is formed in the second transparent electrode layer 19.

In the circuit region 910, a back-gate contact portion (also referred to as an "upper gate contact portion") 40 electrically connecting the back-gate electrode BG with the source electrode 7A or the drain electrode 8A (in this example, the source electrode 7A) of the first TFT 101 is provided. The back-gate contact portion 40 is located in the opening 12P of the organic insulating layer 12 so as to be adjacent to the first TFT 101.

In this example, the back-gate contact portion 40 is located in an opening 30t of the shield layer 30, and includes a transparent connection portion 32 formed of the same transparent conductive film as that of the shield layer 30 (namely, formed in the second transparent electrode layer 19). The transparent connection portion 32 is electrically isolated from the shield layer 30. In the back-gate contact portion 40, the back-gate electrode BG is electrically connected with the source electrode 7A via the transparent connection portion 32. Specifically, an opening 17s exposing the back-gate electrode BG is formed in the second inorganic insulating layer 17, and a back-gate contact hole exposing the source electrode 7A is formed in the back-gate electrode BG, the second inorganic insulating layer 17 and the first inorganic insulating layer 11. As seen in the direction normal to the substrate, the back-gate contact hole includes an opening 15*t* formed in the back-gate electrode BG and openings 17*t* and 11*t* formed in the second inorganic insulating layer 17 and the first inorganic insulating layer 11 and located inside the opening 15*t*. The transparent connection portion 32 is formed on the second inorganic insulating layer 17, in the opening 17*s* and in the back-gate contact hole, is in contact with the back-gate electrode BG in the opening 17*s*, and is in contact with the source electrode 7A in the back-gate contact hole.

The source electrode 7A of the first TFT 101 may be connected with the gate line GL. In this example, the source electrode 7A is in direct contact with the gate line GL in an opening formed in the gate insulating layer 4.

The shield layer 30 is located to cover at least a part of the peripheral circuit (in this example, gate driver). Preferably, the shield layer 30 overlaps the back-gate electrode BG at least partially as seen in the direction normal to the substrate. More preferably, the shield layer 30 is located to overlap the entirety of the back-gate electrode BG. In this example, the shield layer 30 covers the circuit region 910 except for a region where the back-gate contact portion 40 is formed.

In the COM line region 920, a COM contact portion 50 is provided. The COM contact portion 50 electrically connects the common electrode CE extending from the pixel region and the shield layer 30 extending from the circuit region 910 with a common line (COM line) 7C. The COM line 7C is formed of, for example, the same conductive film as that of the source line SL.

In this example, in the COM contact region 920, the common electrode CE is electrically connected with the COM line 7C via the shield layer 30. Specifically, an opening 17*q* exposing the common electrode CE is formed in the second inorganic insulating layer 17, and a COM contact hole exposing the COM line 7C is formed in the second inorganic insulating layer 17 and the interlayer insulating layer 13. As seen in the direction normal to the substrate, the COM contact hole includes an opening 12R formed in the organic insulating layer 12 and openings 17*r* and 11*r* formed in the second inorganic insulating layer 17 and the first inorganic insulating layer 11 and located inside the opening 12R. The shield layer 30 is formed on the second inorganic insulating layer 17, in the opening 17*q* and in the COM contact hole, is in contact with the common electrode CE in the opening 17*q*, and is in contact with the COM line 7C in the COM contact hole.

The structure of the active matrix substrate according to this embodiment is not limited to the structure shown in FIG. 8 and FIG. 9. For example, the back-gate electrode BG is connected with the source electrode 7A in the back-gate contact region 40. Alternatively, the back-gate electrode BG may be connected with the drain electrode 8A or the gate electrode 3A. Still alternatively, the back-gate electrode BG may be electrically connected with the common electrode CE. The back-gate electrode BG may be connected with another power supply. The planar shape of each layer, the positional arrangement of the layers, and the like are not limited to those shown in the figures.

In the case where the back-gate electrode BG is connected with the common electrode CE, the shield layer 30 may or may not overlap the first TFT 101. Even if the shield layer 30 does not overlap the first TFT 101, the display characteristics are suppressed from being deteriorated due to the charge because the back-gate electrode BG acts also as a shield layer. It should be noted that in the case where the shield layer 30 overlaps the first TFT 101, the invasion of moisture or the like into the oxide semiconductor layer 5A is suppressed more effectively.

For example, Japanese Laid-Open Patent Publication No. 2014-103142 proposes a structure in which a back-gate electrode is provided on an organic insulating layer. However, in the case where the back-gate electrode is provided on the organic insulating layer, the organic insulating layer, which is relatively thick, is located between the semiconductor layer and the back-gate electrode. This decreases the effect of suppressing the change in the threshold voltage. By contrast, in this embodiment, the opening 12P is formed in the organic insulating layer 12, and therefore, no organic insulating layer is located between the back-gate electrode BG and the oxide semiconductor layer 5A. Only a relatively thin inorganic insulating layer (in an etch-stop structure, the first inorganic insulating layer 11 and the etch-stop layer; and in a channel-etch structure, the first inorganic insulating layer 11) is located between the back-gate electrode BG and the oxide semiconductor layer 5A. For this reason, the control on the threshold value of the first TFT 101 by the back-gate electrode BG is performed more appropriately.

<Method for Producing the Active Matrix Substrate 1001>

With reference to FIG. 8 and FIG. 9, a method for producing the active matrix substrate 1001 will be described.

First, a circuit including the first TFT 101, the second TFT 102, the gate line GL, the source line SL and the like are formed on the substrate by a known method.

Specifically, a gate line layer including the gate line GL and the gate electrodes 3A and 3B is formed on the substrate. As the substrate, for example, a glass substrate, a silicon substrate, a heat-resistant plastic substrate (resin substrate) or the like is usable. The gate line layer is obtained by forming a conductive film for the gate (thickness: e.g., 50 nm or greater and 500 nm or less) on the substrate 1 by sputtering or the like and patterning the conductive film. As the conductive film for the gate, a film containing a metal material such as aluminum (Al), tungsten (W), molybdenum (Mo), tantalum (Ta), chromium (Cr), titanium (Ti), copper (Co) or the like, an alloy thereof, or a metal nitride thereof is appropriately usable. Alternatively, a stack film including a plurality of such films in a stacked manner is usable. A Cu film and a Ti film are formed in this order to obtain the stack film.

Next, a gate insulating layer (thickness: e.g., 200 nm or greater and 500 nm or less) 4 is formed by CVD or the like so as to cover the gate line layer. As the gate insulating layer 4, a silicon oxide ($SiO_x$) layer, a silicon nitride ($SiN_x$) layer, a silicon oxide nitride ($SiO_xN_y$; x>y) layer, a silicon nitride oxide ($SiN_xO_y$; x>y) layer or the like is appropriately usable. The gate insulating layer 4 may have a stack structure. In this example, a stack film including an $SiN_x$ layer as a lower layer and an $SiO_x$ layer as an upper layer is used.

Next, an oxide semiconductor film is formed on the gate insulating layer 4, and the oxide semiconductor film (thickness: e.g., 15 nm or greater and 200 nm or less) is patterned, so that the oxide semiconductor layer 5A to act as the active layer of the first TFT 101 and the oxide semiconductor layer 5B to act as the active layer of the second TFT 102 are formed. The oxide semiconductor film may have a stack structure.

Next, an opening 4*u* reaching the gate line GL is formed in the gate insulating layer 4 by known photolithography.

Then, a conductive film for the source (thickness: e.g., 50 nm or greater and 500 nm or less) is formed on the substrate and is patterned, so that the source line SL, the source electrodes 7A and 7B and the drain electrodes 8A and 8B in contact with the oxide semiconductor layers 5A and 5B, and the COM line 7C are formed. Thus, the first TFT 101 and the second TFT 102 are obtained. As the conductive film for the source, a film containing a metal material such as aluminum (Al), tungsten (W), molybdenum (Mo), tantalum (Ta), chromium (Cr), titanium (Ti), copper (Co) or the like, an alloy thereof, or a metal nitride thereof is appropriately usable. Alternatively, a stack film including a plurality of such films in a stacked manner is usable. Still alternatively, a conductive oxide film of IZO (In—Zn—O) or the like is usable. In this example, a Ti film and a Cu film are formed in this order to obtain the stack film.

Next, the first inorganic insulating layer (thickness: e.g., 100 to 500 nm, preferably 200 to 500 nm) 11 is formed by, for example, CVD so as to cover the first TFT 101 and the second TFT 102.

As the first inorganic insulating layer 11, an inorganic insulating film (passivation film) such as a silicon oxide ($SiO_x$) film, a silicon nitride ($SiN_x$) film, a silicon oxide nitride ($SiO_xN_y$; x>y) film, a silicon nitride oxide ($SiN_xO_y$; x>y) film or the like is usable. As described above, it is preferred to use an silicon oxide film from the point of view of recovering the oxide semiconductor layers 5A and 5B from oxygen deficiency. Alternatively, the first inorganic insulating layer 11 may be a stack film. In this example, a stack film including an $SiO_x$ film as a lower layer and an $SiN_x$ film as an upper layer is formed as the first inorganic insulating layer 11.

Next, an organic insulating layer (thickness: e.g., 1 to 3 μm, preferably 2 to 3 μm) 12 is formed on the first inorganic insulating layer 11. As the organic insulating layer 12, an organic insulating film containing a photosensitive resin material may be formed. Next, the organic insulating layer 12 is patterned by a photolithography step, so that the openings 12P, 12Q and 12R are formed in the organic insulating layer 12. The opening 12P is located to expose a portion of the first inorganic insulating layer 11 that is located above the first TFT 101. The opening 12Q is located in each pixel region of the display region 800 so as to expose a part of the drain electrode 8B. The opening 12R is located on the COM line 7C in the COM line region 920.

Next, a first transparent conductive film (thickness: e.g., 50 nm or greater and 200 nm or less) is formed on the organic insulating layer 12 and in the openings 12P, 12Q and 12R. As the first transparent conductive film, for example, an ITO (indium tin oxide) film, an In—Zn—O-based oxide (indium zinc oxide) film, a ZnO film (zinc oxide film) or the like is usable.

Next, the first transparent conductive film is patterned, so that the first transparent electrode layer 15 including the common electrode CE and the back-gate electrode BG is formed. The back-gate electrode BG is located in the opening 12P of the organic insulating layer 12, and includes the opening 15t exposing the first inorganic insulating layer 11. The common electrode CE is provided in substantially the entirety of the display region 800. As seen in the direction normal to the substrate, the common electrode CE includes the opening 15p located outside the opening 12Q The common electrode CE is not formed in a region of the COM line 7C where the COM contact portion 50 is to be formed. In this example, the common electrode CE covers a part of the COM line 7C, and has an end portion 15e on the COM line 7C.

Next, the second inorganic insulating layer 17 is formed to cover the first transparent electrode layer 15. As the second inorganic insulating layer 17, a silicon nitride ($SiN_x$) film, a silicon oxide ($SiO_x$) film, a silicon oxide nitride ($SiO_xN_y$; x>y) film, a silicon nitride oxide ($SiN_xO_y$; x>y) film or the like is appropriately usable. In the case where a storage capacitance is formed by the common electrode CE, the second inorganic insulating layer 17 and the pixel electrode PE, $SiN_x$ is preferably usable as the second inorganic insulating layer 17 from the points of view of the dielectric constant and the insulating property. $SiN_x$ also has a high moisture resistance and thus more effectively suppresses the invasion of moisture into the oxide semiconductor layer 5A. The second inorganic insulating layer 17 has a thickness of, for example, 70 nm or greater and 300 nm or less.

Then, a resist layer (not shown) is formed, and the second inorganic insulating layer 17 and the first inorganic insulating layer 11 are etched, using the resist layer and the organic insulating layer 12 as an etching mask. The second inorganic insulating layer 17 and the first inorganic insulating layer 11 may be etched at the same time. In this case, end surfaces of the second inorganic insulating layer 17 and the first inorganic insulating layer 11 are aligned to each other.

As a result of the above-described etching, in the opening 12Q, an opening 17p and the opening lip are formed in the second inorganic insulating layer 17 and the first inorganic insulating layer 11, so that the pixel contact hole is obtained. In the opening 12R, the openings 17r and 11r are formed in the second inorganic insulating layer 17 and the first inorganic insulating layer 11, so that the COM contact hole is obtained. In the opening 15t of the back-gate electrode BG, the openings 17t and 11t are formed in the second inorganic insulating layer 17 and the first inorganic insulating layer 11, so that the back-gate contact hole is obtained. The openings 17q and 17a are formed in the second inorganic insulating layer 17, using the common electrode CE and the back-gate electrode BG as an etch-stop.

Next, a second transparent conductive film is formed on the second inorganic insulating layer 17 and in the contact holes and is patterned, so that the second transparent electrode layer 19 including the pixel electrode PE, the shield layer 30 and the transparent connection portion 32 is formed. The pixel electrode PE is located to contact the drain electrode 8B in the pixel contact hole. The shield layer 30 is located to overlap at least a part of the first TFT 101 and at least a part of the peripheral circuit. The shield layer 30 contacts the COM line 7C in the COM contact hole, and contacts the common electrode CE in the opening 17q. The transparent connection portion 32 is located to contact the back-gate electrode BG in the opening 17a and to contact the source electrode 7A in the back-gate contact hole. The preferred material and the thickness of the second transparent conductive film may be the same as those of the first transparent conductive film. In this manner, the active matrix substrate 1001 is produced.

According to the above-described method, the active matrix substrate 1001 is produced by use of a conventional process for producing a TFT substrate for a display device, with no addition of a step of providing the back-gate electrode BG.

<Modifications>

Figure 10:
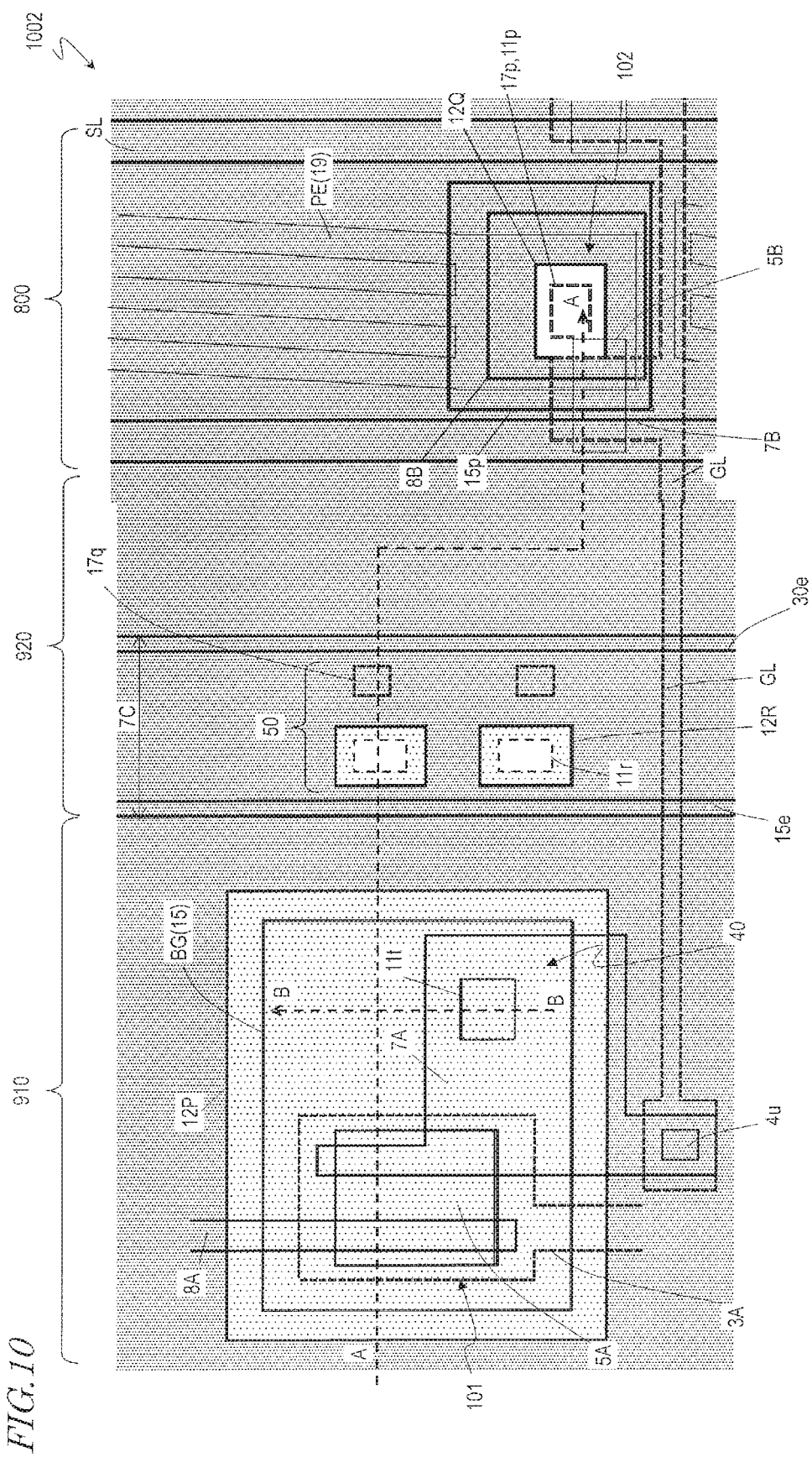
FIG. 10 is a schematic plan view showing another active matrix substrate 1002 according to embodiment 1 as an example.
Figure 11:
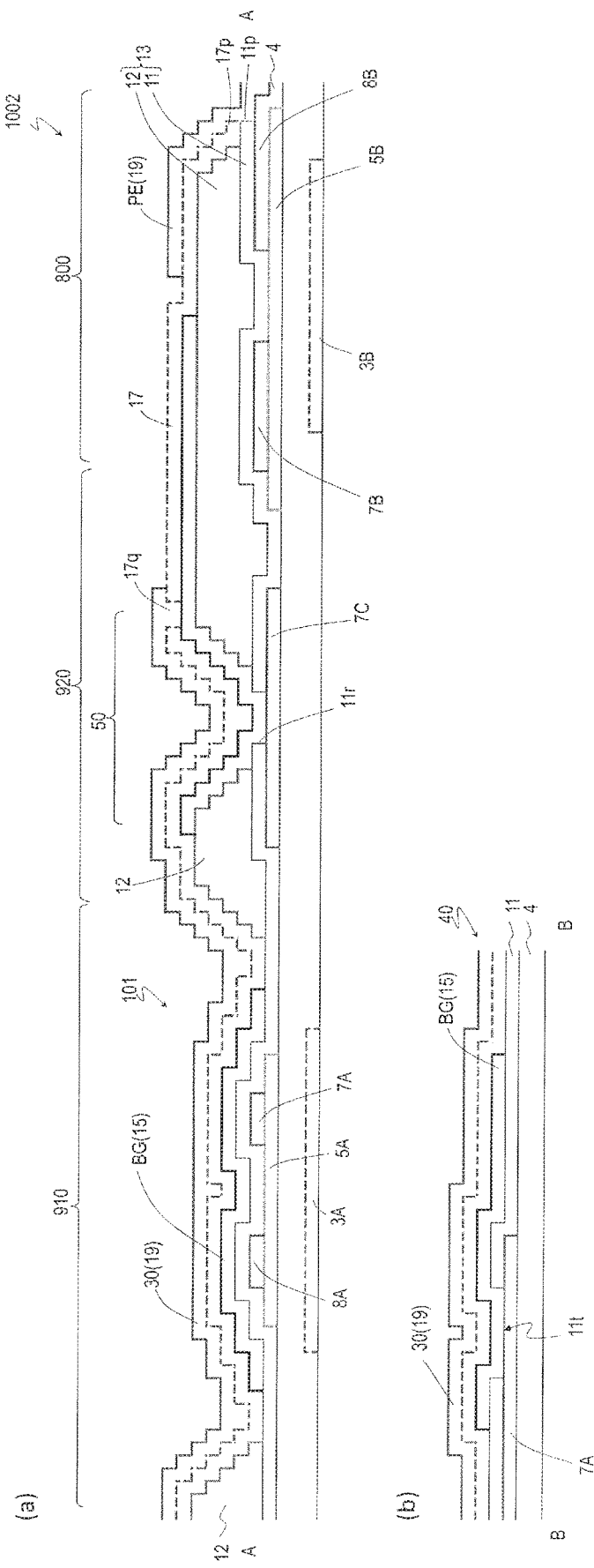
FIG. 11(a) and FIG. 11(b) are each a schematic cross-sectional view of the active matrix substrate 1002.

FIG. 10 is a schematic plan view showing another active matrix substrate 1002 according to this embodiment as an example. FIG. 11(a) and FIG. 11(b) are each a schematic cross-sectional view of the active matrix substrate 1002, and respectively show cross-sectional structures taken along lines A-A and B-B in FIG. 10. In FIG. 10 and FIG. 11, elements substantially the same as those in FIG. 8 and FIG. 9 bear the identical reference signs thereto. The active matrix substrate 1002 and the active matrix substrate 1001 shown in FIG. 8 and FIG. 9 are different from each other in the structures of the back-gate contact portion 40 and the COM contact portion 50. In the following, differences from the active matrix substrate 1001 will be described, and the same descriptions as those made above will be omitted appropriately.

In the back-gate contact portion 40, the back-gate electrode BG is in contact with the source electrode 7A in the opening 11*t* (back-gate contact hole) formed in the first inorganic insulating layer 11. In this example, there is no need to form an opening for forming the back-gate contact hole in the shield layer 30. Therefore, as shown in the figures, the shield layer 30 may be located to cover the entirety of the first TFT 101 and the entirety of the back-gate contact portion 40.

In the COM contact portion 50, the common electrode CE is in direct contact with the COM line 7C in the opening (COM contact hole) 11*r* formed in the first inorganic insulating layer 11. The shield layer 30 is in contact with the common electrode CE in the opening 17*q* formed in the second inorganic insulating layer 17. In this example, the common electrode CE, the second inorganic insulating layer 17 and the shield layer 30 are located to cover the COM contact portion 50. The shield layer 30 extending to the COM line region 920 has an end portion 30*e* on, for example, the COM line 7C.

In the active matrix substrate 1001 shown in FIG. 8 and FIG. 9, the back-gate electrode BG is connected with the source electrode 7A via the transparent connection portion formed of the same transparent conductive film as that of the shield layer 30. Therefore, the region where the back-gate contact portion 40 is formed is not allowed to be covered with the shield layer 30. By contrast, in the active matrix substrate 1002, the entirety of the back-gate contact portion 40 is allowed to be covered with the shield layer 30. Therefore, the display characteristics are suppressed more effectively from being deteriorated due to the charge.

Now, with reference to FIG. 10 and FIG. 11, a method for producing the active matrix substrate 1002 will be described. In the following, only differences from the method for producing the active matrix substrate 1001 will be described. The materials, the thicknesses, the formation processes and the like of the layers are substantially the same as those for the active matrix substrate 1001, and the same descriptions as those made above will be omitted appropriately.

The peripheral circuit including the first TFT 101, the second TFT 102, the gate line GL, the source line SL, the COM line 7C and the like are formed on the substrate by substantially the same method as for the active matrix substrate 1001. Then, the first inorganic insulating layer 11 and the organic insulating layer 12 are formed in this order by, for example, CVD so as to cover the first TFT 101 and the second TFT 102. In the organic insulating layer 12, the openings 12P, 12R and 12Q are formed.

After the organic insulating layer 12 is formed, the first inorganic insulating layer 11 is etched, using the resist layer (not shown) and the organic insulating layer 12 as an etching mask. In this example, in the COM line region 920, the opening 11*r* exposing the COM line 7C is formed in the opening 12R of the organic insulating layer 12. In the circuit region 910, the opening 11*t* exposing the source electrode 7A is formed in the opening 12P of the organic insulating layer 12.

Next, the first transparent conductive film is formed on the organic insulating layer 12 and in the openings and is patterned, so that the first transparent electrode layer 15 including the common electrode CE and the back-gate electrode BG is formed. The common electrode CE is located to have the opening 15*p* on the drain electrode 8B and to contact the COM line 7C in the opening 11*r* in the COM line region 920. The back-gate electrode BG is located to contact the source electrode 7A in the opening 11*t*.

Next, the second inorganic insulating layer 17 covering the first TFT 101 and the second TFT 102 is formed. Then, the resist layer (not shown) is formed, and the second inorganic insulating layer 17 and the first inorganic insulating layer 11 are etched, using the resist layer and the organic insulating layer 12 as an etching mask, so that the openings 17*p* and 11*p* are formed. In this manner, the pixel contact hole is obtained.

Next, the second transparent conductive film is formed on the second inorganic insulating layer 17 and in the pixel contact hole and is patterned, so that the second transparent electrode layer 19 including the pixel electrode PE and the shield layer 30 is formed. The pixel electrode PE contacts the drain electrode 8B in the pixel contact hole. The shield layer 30 is located to contact the common electrode CE in the opening 17*q*. As a result, the shield layer 30 is electrically connected with the COM line 7C via the common electrode CE. In this manner, the active matrix substrate 1002 is produced.

Figure 12:
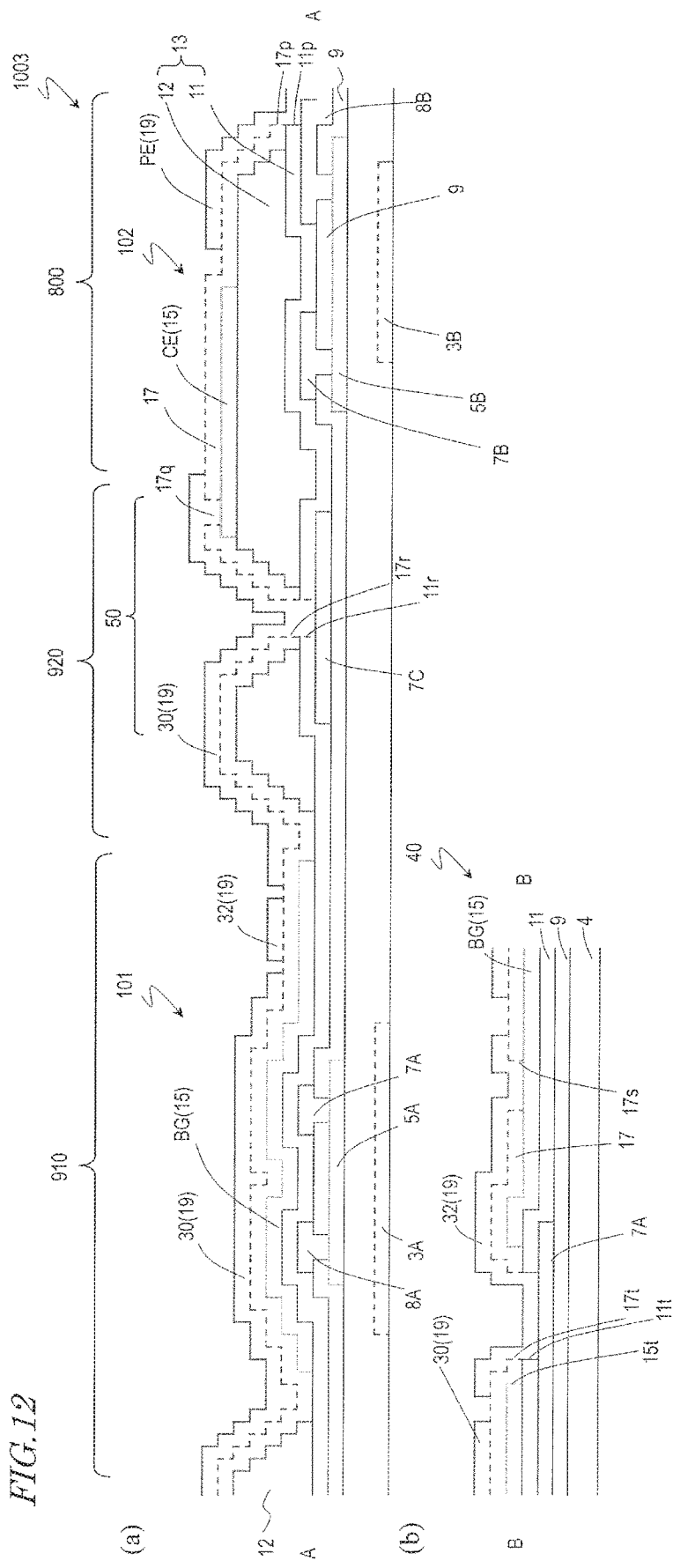
FIG. 12(a) and FIG. 12(b) are each a schematic cross-sectional view of still another active matrix substrate 1003 in embodiment 1.

FIG. 12 provides cross-sectional views showing still another active matrix substrate according to this embodiment. A plan view is substantially the same as FIG. 8 and thus will be omitted. FIG. 12(*a*) and FIG. 12(*b*) respectively show cross-sectional structures taken along lines A-A and B-B in FIG. 8.

In an active matrix substrate 1003 shown in FIG. 12, the first TFT 101 and the second TFT 102 are etch-stop TFTs, unlike in the active matrix substrate 1001 (FIG. 8 and FIG. 9). In the following, differences from the active matrix substrate 1001 will be described, and the same descriptions as those made above will be omitted appropriately.

The oxide semiconductor layer 5A of the first TFT 101 and the oxide semiconductor layer 5B of the first TFT 102 are covered with an etch-stop layer 9. The etch-stop layer 9 is an inorganic insulating layer. In the etch-stop layer 9, openings reaching the source contact regions and the drain contact regions of the oxide semiconductor layers 5A and 5B are formed. The source and drain electrodes 7A, 8A, 7B and 8B are in contact with the oxide semiconductor layers 5A and 5B in the openings of the etch-stop layer 9. It is sufficient that the etch-stop layer 9 covers at least the channel regions of the oxide semiconductor layers 5A and 5B, and the etch-stop layer 9 is not limited to having the structure shown in the figures.

In the active matrix substrate 1003, in the first TFT 101, the first inorganic insulating layer 11 and the etch-stop layer 9 are located between the back-gate electrode BG and the oxide semiconductor layer 5B, and act together as the upper gate insulating layer.

The active matrix substrate 1003 may be produced by substantially the same method as for the active matrix substrate 1001. It should be noted that the etch-stop layer 9 is formed after the oxide semiconductor layers 5A and 5B are formed but before a source line layer is formed. As the etch-stop layer 9, a silicon oxide ($SiO_x$) layer, a silicon nitride ($SiN_x$) layer, a silicon oxide nitride ($SiO_xN_y$; x>y) layer, a silicon nitride oxide ($SiN_xO_y$; x>y) layer or the like is appropriately usable. The etch-stop layer 9 may have a stack structure. The etch-stop layer 9 may have a thickness of, for example, 30 nm or greater and 200 nm or less. Then, the etch-stop layer 9 is patterned, so that the openings exposing the source contact regions and the drain contact regions of the oxide semiconductor layers 5A and 5B are formed. Then, a source conductive film is formed and is patterned, so that the source line layer including the source electrodes 7A and 7B and the drain electrodes 8A and 8B is obtained. In this patterning (source/drain separation) step, the etch-stop layer 9 acts as a protective layer for the oxide semiconductor layers 5A and 5B.

Embodiment 2

In an active matrix substrate according to embodiment 2, the upper transparent electrode acts as the common electrode CE and the lower transparent electrode acts as the pixel electrode PE, unlike in the active matrix substrate according to embodiment 1. In this embodiment, the back-gate electrode BG of the first TFT is formed of the same transparent conductive film as that of the pixel electrode PE, and the shield layer 30 is formed of the same transparent conductive film as that of the common electrode CE.

Figure 13:
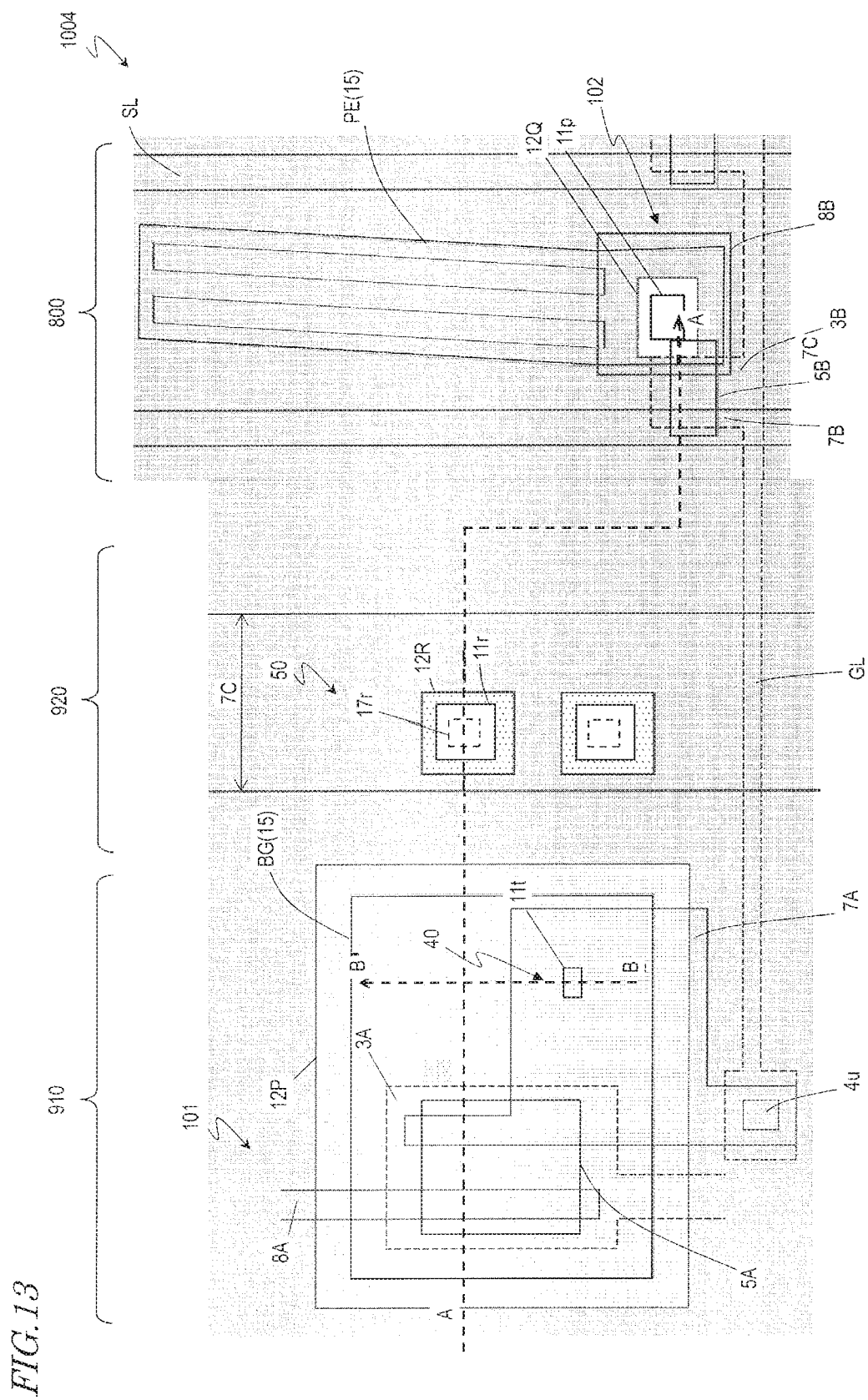
FIG. 13 is a schematic plan view showing an active matrix substrate 1004 according to embodiment 2 as an example.
Figure 14:
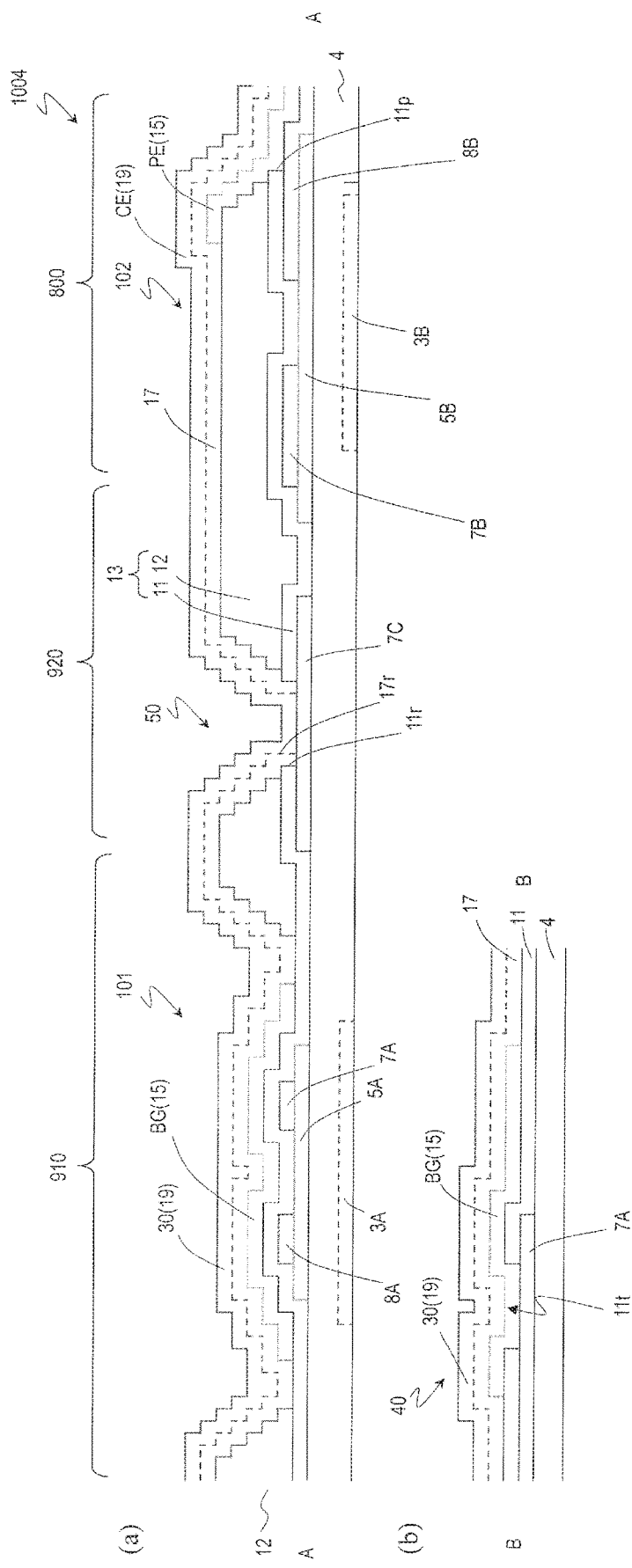
FIG. 14(a) and FIG. 14(b) are each a schematic cross-sectional view of the active matrix substrate 1004.

FIG. 13 is a schematic plan view showing an active matrix substrate 1004 according to this embodiment as an example. FIG. 14(a) and FIG. 14(b) are each a schematic cross-sectional view of the active matrix substrate 1004, and respectively show cross-sectional structures taken along lines A-A and B-B in FIG. 13. In FIG. 13 and FIG. 14, elements substantially the same as those in FIG. 8 through FIG. 10 bear the identical reference signs thereto. In the following, differences from the active matrix substrate 1002 will be described, and the same descriptions as those made above will be omitted appropriately.

In each of the pixel regions of the display region 800, the second TFT 102 as the pixel TFT, the source line SL, the gate line GL, the interlayer insulating layer 13 covering the source line SL and the gate line GL, the pixel electrode PE provided on the interlayer insulating layer 13, and the common electrode CE located on the pixel electrode PE with the second inorganic insulating layer 17 being located between the common electrode CE and the pixel electrode PE are formed.

The pixel electrode PE is provided in each of the pixels. The pixel electrode PE is connected with the drain electrode 8B of the second TFT 102 in the pixel contact hole formed in the interlayer insulating layer 13. In this example, the pixel contact hole includes the opening 12Q formed in the organic insulating layer 12 and the opening 11p formed in the first inorganic insulating layer 11. The opening 11p is located inside the opening 12Q of the organic insulating layer 12 as seen in the direction normal to the substrate.

The common electrode CE does not need to be provided in each of the pixels. In this example, the common electrode CE is formed in substantially the entirety of the display region, and has at least one slit or cutout in each pixel region.

In the COM contact portion 50, the common electrode CE is electrically connected with the common line 7C in the COM contact hole. As seen in the direction normal to the substrate, the COM contact hole includes the openings 12R and 11r formed in the organic insulating layer 12 and the first inorganic insulating layer 11 and the opening 17r formed in the second inorganic insulating layer 17 and located inside the opening 12R. The common electrode CE extends to the circuit region 910 and acts also as the shield layer 30. Namely, the common electrode CE and the shield layer 30 are formed integrally (continuously) with each other and may have the same potential as each other. Therefore, in this embodiment, a contact portion connecting the shield layer 30 and the common electrode CE to each other is not needed.

The structures of the first TFT 101 and the back-gate contact portion 40 in the circuit region 910 are substantially the same as those in the active matrix substrate 1002 shown in FIG. 10 and FIG. 11.

<Method for Producing the Active Matrix Substrate 1004>

With reference to FIG. 13 and FIG. 14, a method for producing the active matrix substrate 1004 will be described. In the following, only differences from the method for producing the active matrix substrate 1002 (FIG. 10 and FIG. 11) will be described. The materials, the thicknesses, the formation processes and the like of the layers are substantially the same as those for the active matrix substrate 1001 and the active matrix substrate 1002, and the same descriptions as those made above will be omitted appropriately.

First, the peripheral circuit including the first TFT 101, the second TFT 102, the gate line GL, the source line SL, the COM line 7C and the like are formed on the substrate. Then, the first inorganic insulating layer 11 and the organic insulating layer 12 are formed in this order by, for example, CVD so as to cover the first TFT 101 and the second TFT 102. In the organic insulating layer 12, the openings 12P, 12R and 12Q are formed as in the above-described embodiment.

After the organic insulating layer 12 is formed, the first inorganic insulating layer 11 is etched, using the resist layer (not shown) and the organic insulating layer 12 as an etching mask. In the display region 800, the opening 11p is formed in the first inorganic insulating layer 11 in the opening 12Q, so that the pixel contact hole is obtained. In the COM line region 920, the opening 11r is formed in the first inorganic insulating layer 11 in the opening 12R. In the circuit region 910, the opening 11t is formed in the first inorganic insulating layer 11 in the opening 12P, so that the back-gate contact hole is obtained.

Next, the first transparent conductive film is formed on the organic insulating layer 12 and in the openings and is patterned, so that the first transparent electrode layer 15 including the pixel electrode PE and the back-gate electrode BG is formed. In the display region 800, the pixel electrode PE is provided on the organic insulating layer 12 and in the pixel contact hole, and is located to contact the drain electrode 8B in the pixel contact hole. The back-gate electrode BG is located to contact the source electrode 7A in the opening 11t.

Next, the second inorganic insulating layer 17 covering the first TFT 101 and the second TFT 102 is formed. Then, the opening 17r is formed in the second inorganic insulating layer 17 in the opening 12R, using the resist layer (not shown) as an etching mask, so that the COM contact hole is obtained.

Next, the second transparent conductive film is formed on the second inorganic insulating layer 17 and in the COM contact hole and is patterned, so that the second transparent electrode layer 19 including the common electrode CE and the shield layer 30 is obtained. The shield layer 30 and the common electrode CE are formed integrally with each other and contact the COM line 7C in the COM contact hole. In this manner, the active matrix substrate 1004 is produced.

Embodiment 3

In an active matrix substrate according to embodiment 3, the interlayer insulating layer 13 includes no organic insulating layer, unlike in the active matrix substrate according to embodiment 1 or 2.

Figure 15:
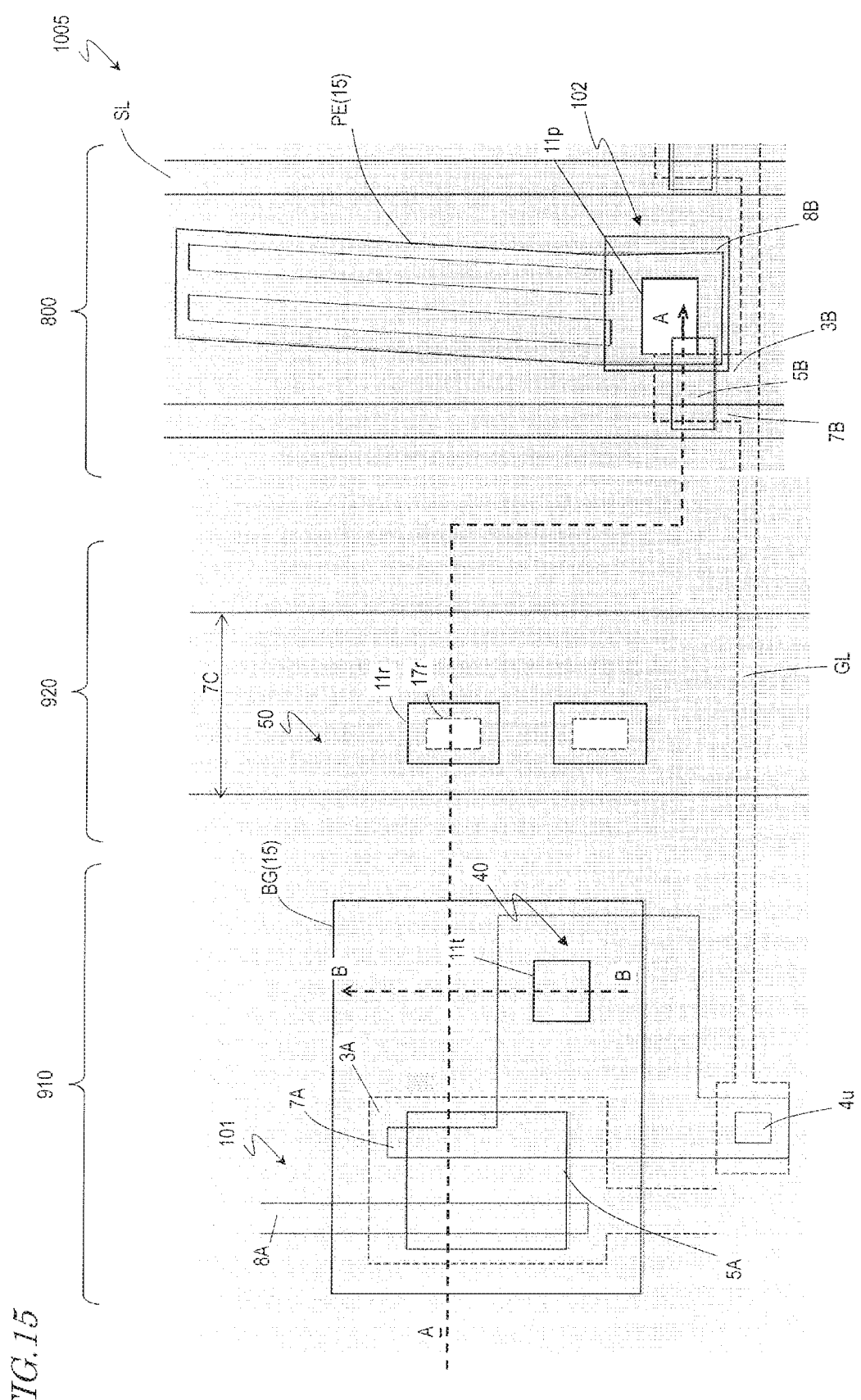
FIG. 15 is a schematic plan view showing an active matrix substrate 1005 according to embodiment 3 as an example.
Figure 16:
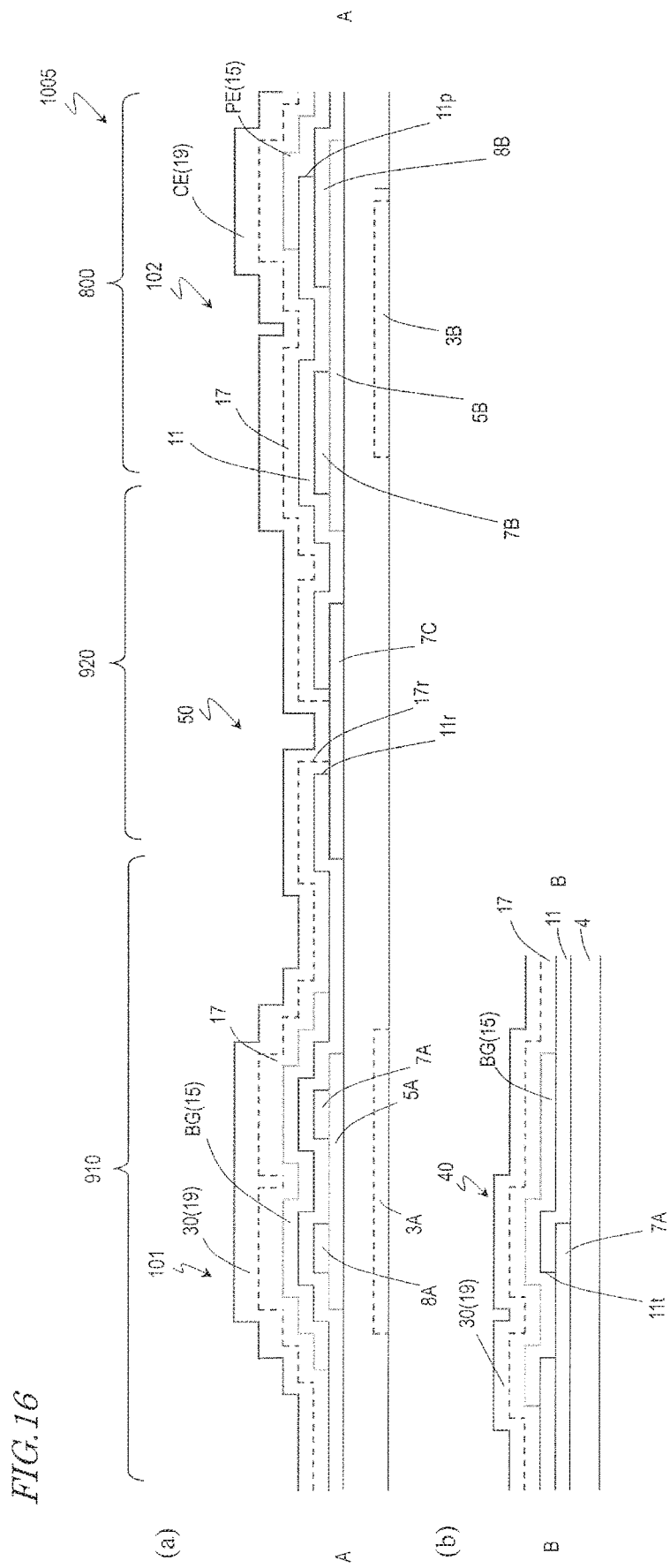
FIG. 16(a) and FIG. 16(b) are each a schematic cross-sectional view of the active matrix substrate 1005.

FIG. 15 is a schematic plan view showing an active matrix substrate 1005 according to this embodiment as an example. FIG. 16(a) and FIG. 16(b) are each a schematic cross-sectional view of the active matrix substrate 1005, and respectively show cross-sectional structures taken along lines A-A and B-B in FIG. 15. In FIG. 15 and FIG. 16, elements substantially the same as those in FIG. 8 through FIG. 14 bear the identical reference signs thereto. In this embodiment, an example in which the upper transparent electrode acts as the common electrode CE and the lower transparent electrode acts as the pixel electrode PE will be described. Alternatively, the upper transparent electrode may act as the pixel electrode PE and the lower transparent electrode may act as the common electrode CE. In the following, differences from the active matrix substrate 1004 (FIG. 13 and FIG. 14) according to embodiment 2 will be described, and the same descriptions as those made above will be omitted appropriately.

In the active matrix substrate 1005, the first TFT 101 and the second TFT 102 have substantially the same structures as those in modification 2 shown in FIG. 3. The interlayer insulating layer 13 includes the inorganic insulating layer (passivation layer) 11 but does not include a flattening film or an organic insulating film.

In the display region 800, the first inorganic insulating layer 11 is formed to cover the second TFT 102, and the pixel electrode PE is provided on the first inorganic insulating layer 11. The pixel electrode PE is in contact with the drain electrode 8B in the opening 11p (pixel contact hole) formed in the first inorganic insulating layer 11. On the pixel electrode PE, the second inorganic insulating layer 17 and the common electrode CE are provided.

In the COM line region 920, the common electrode CE is in contact with the COM line 7C in the COM contact hole formed in the first inorganic insulating layer 11 and the second inorganic insulating layer 12. In this example, as seen in the direction normal to the substrate, the COM contact hole includes the opening 11r formed in the first inorganic insulating layer 11 and the opening 17r formed in the second inorganic insulating layer 17 and located inside the opening 11r. It is sufficient that the opening 17r is located to overlap the opening 11r at least partially as seen in the direction normal to the substrate.

The circuit region 910 has substantially the same structure as that in the active matrix substrate 1004 except that the organic insulating layer 12 is not formed in this embodiment. In this example also, the shield layer 30 is formed integrally with the common electrode CE and has the common potential.

In the active matrix substrate 1004 according to the above-described embodiment, the second inorganic insulating layer 17, which acts as a protective film, is formed on the organic insulating layer. Therefore, it is difficult to form the second inorganic insulating layer 17 at a high temperature. The temperature at which the second inorganic insulating layer 17 is to be formed is set to, for example, 150° C. or higher and 200° C. or lower. Therefore, the amount of hydrogen contained in the formed second inorganic insulating layer 17 may possibly be increased. By contrast, in this embodiment, the organic insulating layer is not formed. Therefore, the second inorganic insulating layer 17 is allowed to be formed at a higher temperature (e.g., 200° C. or higher and 350° C. or lower). Since the amount of hydrogen contained in the formed second inorganic insulating layer 17 is decreased for this reason, the first TFT 101 is suppressed more effectively from being put into a depletion state due to hydrogen desorbed from the second inorganic insulating layer 17 (desorbed hydrogen).

<Method for Producing the Active Matrix Substrate 1005>

With reference to FIG. 15 and FIG. 16, a method for producing the active matrix substrate 1005 will be described. In the following, only differences from the method for producing the active matrix substrate 1004 will be described, and the same descriptions as those made above will be omitted appropriately.

First, the peripheral circuit including the first TFT 101, the second TFT 102, the gate line GL, the source line SL, the COM line 7C and the like are formed on the substrate. Then, the first inorganic insulating layer 11 is formed by, for example, CVD so as to cover the first TFT 101 and the second TFT 102.

Then, the first inorganic insulating layer 11 is etched, using the resist layer (not shown). In the display region 800, the opening 11p is formed in the first inorganic insulating layer 11, so that the pixel contact hole exposing the drain electrode 8B of the second TFT 102 is obtained. In the COM line region 920, the opening 11r exposing the COM line 7C is formed in the first inorganic insulating layer 11. In the circuit region 910, the opening 11t exposing the source electrode 7A is formed in the first inorganic insulating layer 11, so that the back-gate contact hole exposing the source electrode 7A of the first TFT 101 is obtained.

Next, the first transparent conductive film is formed on the first inorganic insulating layer 11 and is patterned, so that the first transparent electrode layer 15 including the pixel electrode PE and the back-gate electrode BG is formed. In the display region 800, the pixel electrode PE is provided on the first inorganic insulating layer 11 and in the pixel contact hole, and is located to contact the drain electrode 8B in the pixel contact hole. The back-gate electrode BG is located to contact the source electrode 7A in the opening 11t.

Next, the second inorganic insulating layer 17 covering the first TFT 101 and the second TFT 102 is formed. Then, the opening 17r exposing the COM line 7C is formed in the second inorganic insulating layer 17, using the resist layer (not shown) as an etching mask. The opening 17r is located inside the opening 11r of the first inorganic insulating layer 11. In this manner, the COM contact hole is obtained.

Next, the second transparent conductive film is formed on the second inorganic insulating layer 17 and in the COM contact hole and is patterned, so that the second transparent electrode layer 19 including the common electrode CE and the shield layer 30 is obtained. The shield layer 30 and the common electrode CE are formed integrally with each other and contact the COM line 7C in the COM contact hole. In this manner, the active matrix substrate 1005 is produced.

Embodiment 4

An active matrix substrate according to embodiment 4 further includes another line layer, different from the first transparent electrode layer 15 or the second transparent electrode layer 19, between the interlayer insulating layer 13 and the second transparent electrode layer 19. The another line layer is, for example, a metal line layer. This line layer may include another line electrically isolated from the pixel electrode and the common electrode. This line layer is usable as a driving line for, for example, a touch panel. In this embodiment, an example in which the upper transparent electrode acts as the common electrode CE and the lower transparent electrode acts as the pixel electrode PE like in the active matrix substrate 1004 (FIG. 13 and FIG. 14) will be described. Alternatively, the upper transparent electrode may act as the pixel electrode PE and the lower transparent electrode may act as the common electrode CE.

Figure 17:
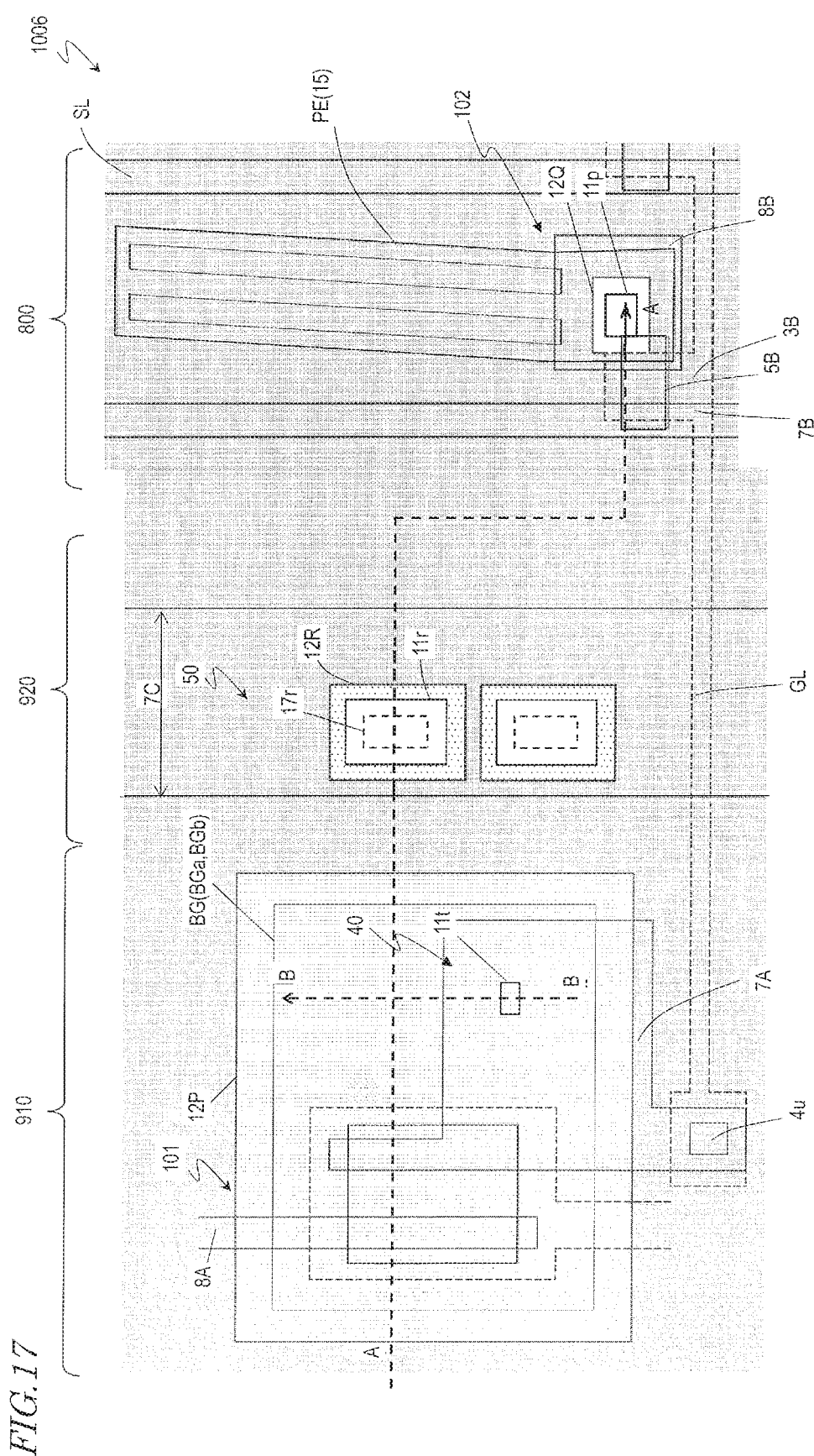
FIG. 17 is a schematic plan view showing an active matrix substrate 1006 according to embodiment 4 as an example.
Figure 18:
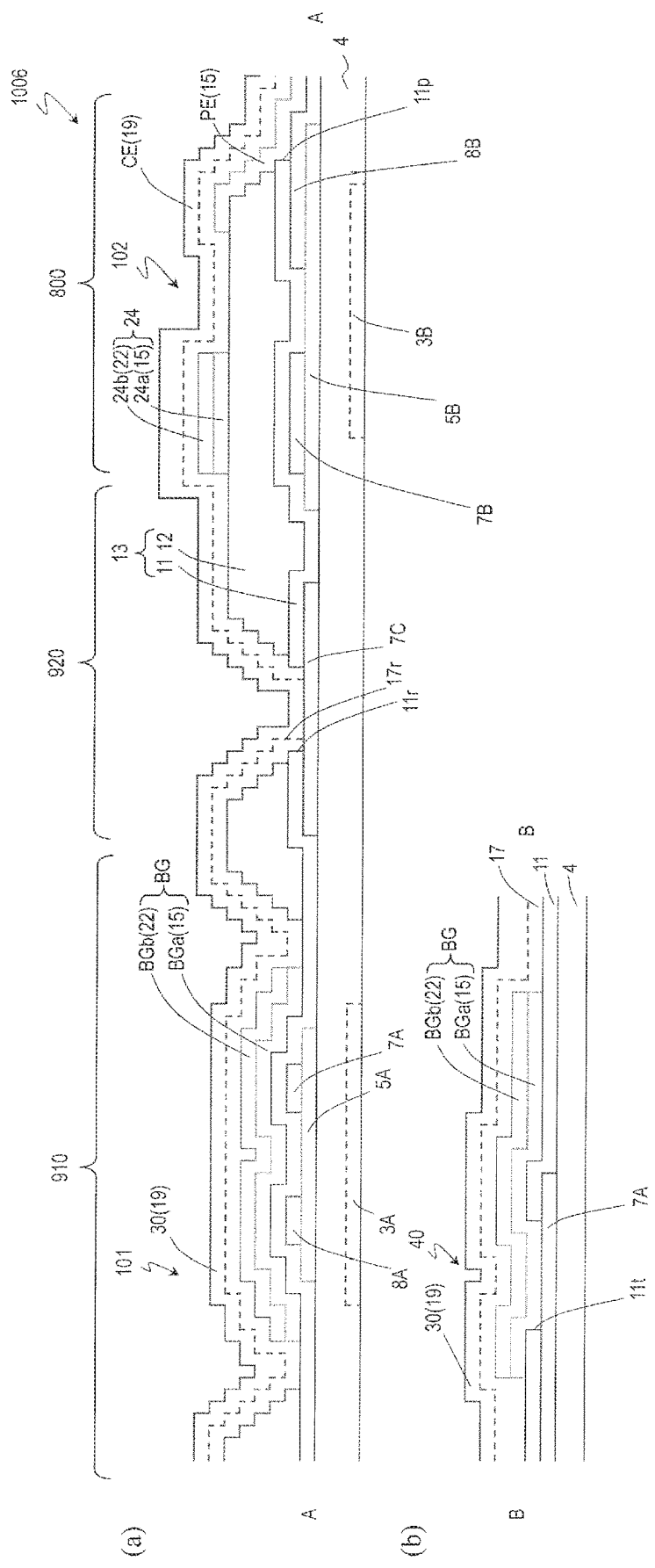
FIG. 18(a) and FIG. 18(b) are each a schematic cross-sectional view of the active matrix substrate 1006.

FIG. 17 is a schematic plan view showing an active matrix substrate 1006 according to this embodiment as an example. FIG. 18(a) and FIG. 18(b) are each a schematic cross-sectional view of the active matrix substrate 1006, and respectively show cross-sectional structures taken along lines A-A and B-B in FIG. 17. In FIG. 17 and FIG. 18, elements substantially the same as those in FIG. 8 through FIG. 16 bear the identical reference signs thereto. In the following, differences from the active matrix substrate 1004 (FIG. 13 and FIG. 14) will be described, and the same descriptions as those made above will be omitted appropriately.

The active matrix substrate 1006 further includes another line layer 22 between the first transparent electrode layer 15 and the second transparent electrode layer 19. In this example, the line layer 22 is in contact with a top surface of the first transparent electrode layer 15. The line layer 22 is, for example, a metal layer such as a Cu layer or the like.

In the display region 800, the pixel electrode PE and a line 24 electrically isolated from the pixel electrode PE are formed on the interlayer insulating layer 13. The line 24 is located to overlap the source line SL as seen in the direction normal to the substrate. The line 24 is a stack line including a lower layer 24a formed of the same transparent conductive film as that of the pixel electrode PE (namely, formed in the line layer 22) and an upper layer 24b formed in the line layer 22. The pixel electrode PE and the line 24 are covered with the second inorganic insulating layer 17, and the common electrode CE is located on the second inorganic insulating layer 17.

The back-gate electrode BG of the first TFT 101 has substantially the same stack structure as that of the line 24. Namely, the back-gate electrode BG is a stack electrode including a lower layer BGa formed of the same transparent conductive film as that of the pixel electrode PE and an upper layer BGb formed in the line layer 22. The rest of the structure is substantially the same as that of the active matrix substrate 1004.

According to this embodiment, the line layer 22 is used to form the back-gate electrode BG including a metal film. Therefore, the invasion of moisture into the oxide semiconductor layer 5A is further alleviated, and the electrical resistance of the back-gate electrode BG is decreased.

<Method for Producing the Active Matrix Substrate 1006>

With reference to FIG. 17 and FIG. 18, a method for producing the active matrix substrate 1006 will be described. In the following, only differences from the method for producing the active matrix substrate 1004 (FIG. 13 and FIG. 14) will be described, and the same descriptions as those made above will be omitted appropriately.

First, the first TFT 101, the second TFT 102, the first inorganic insulating layer 11 and the organic insulating layer 12 are formed in this order on the substrate by substantially the same method as for the active matrix substrate 1004. In the organic insulating layer 12, the openings 12P, 12Q and 12R are formed. Then, the first inorganic insulating layer 11 is etched, using the resist layer (not shown) and the organic insulating layer 12 as an etching mask. As a result, the pixel contact hole and the back-gate contact hole are formed, and in the COM line region 920, the opening 11r is formed in the opening 12R of the organic insulating layer 12.

Next, the first transparent conductive film and a conductive film for the line layer are formed in this order on the organic insulating layer 12 and in the openings. The conductive film for the line layer is, for example, a metal film. As a material of the conductive film for the line layer, a material substantially the same as that of the conductive film for the source or the conductive film for the gate described above is usable. In this example, a Cu film (thickness: e.g., 50 nm or greater and 300 nm or less) is used.

Next, the first transparent conductive film and the conductive film for the line layer are patterned. As a result, the line 24 and the back-gate electrode BG each having a stack structure are formed, and in the region where the pixel electrode is to be formed, a stack body including the first transparent conductive film and the conductive film for the line layer is formed. The line 24 is located to overlap the source line SL as seen in the direction normal to the substrate. The back-gate electrode BG is located to contact the source electrode 7A in the back-gate contact hole.

Next, from the stack body on the region where the pixel electrode is to be formed, only an upper layer formed of the conductive film for the line layer (in this example, the Cu layer) is removed by etching, using the resist layer (not shown). In this manner, the pixel electrode PE formed of the first transparent conductive film is obtained.

Next, the second inorganic insulating layer 17 covering the first TFT 101, the second TFT 102, the pixel electrode PE and the line 24 is formed. Then, the second transparent electrode layer 19 including the common electrode CE and the shield layer 30 is formed. In this manner, the active matrix substrate 1006 is produced.

<Modifications>

Now, modifications of the active matrix substrate according to this embodiment will be described with reference to the drawings.

Figure 19:
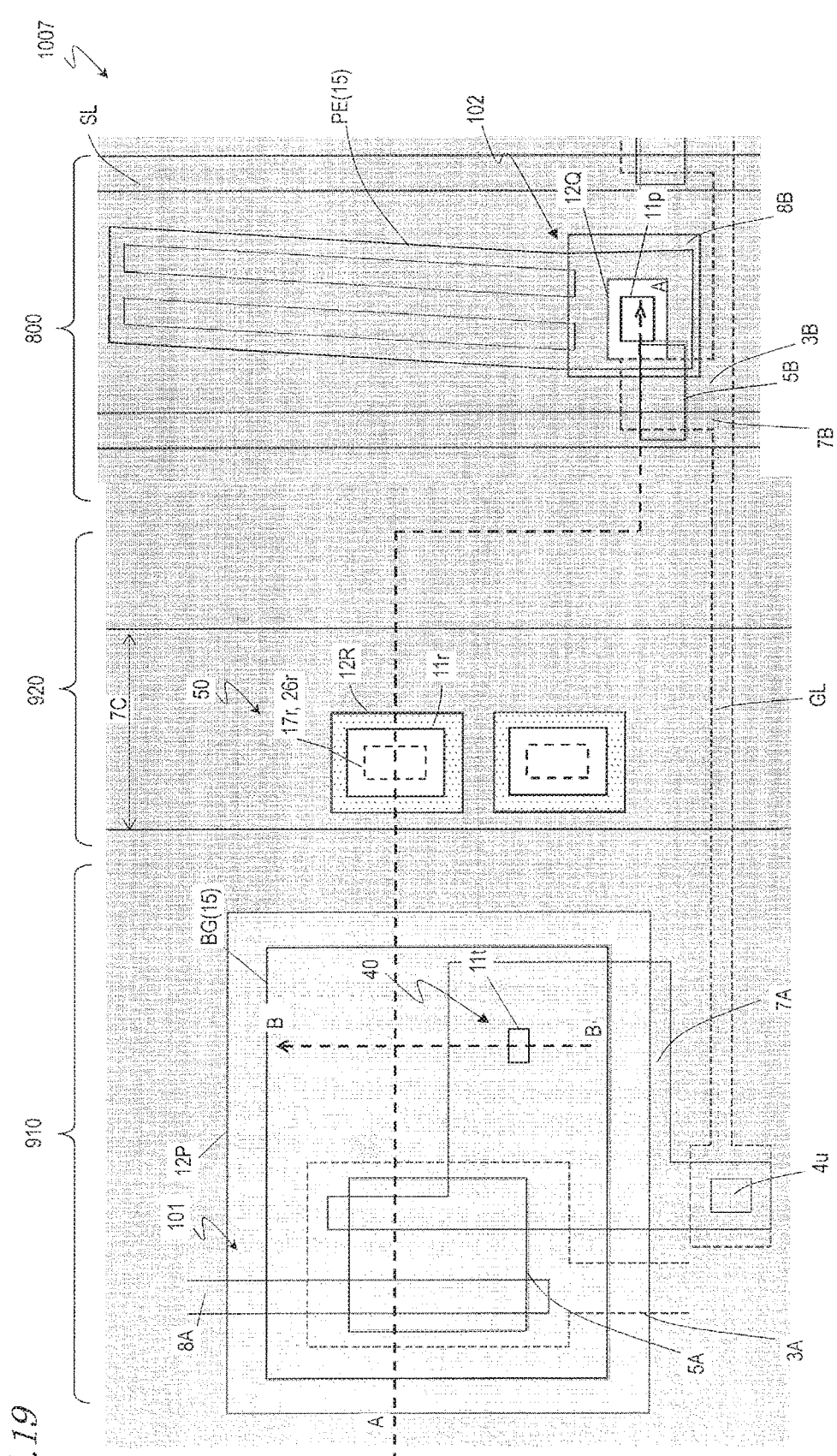
FIG. 19 is a schematic plan view showing another active matrix substrate 1007 according to embodiment 4 as an example.
Figure 20:
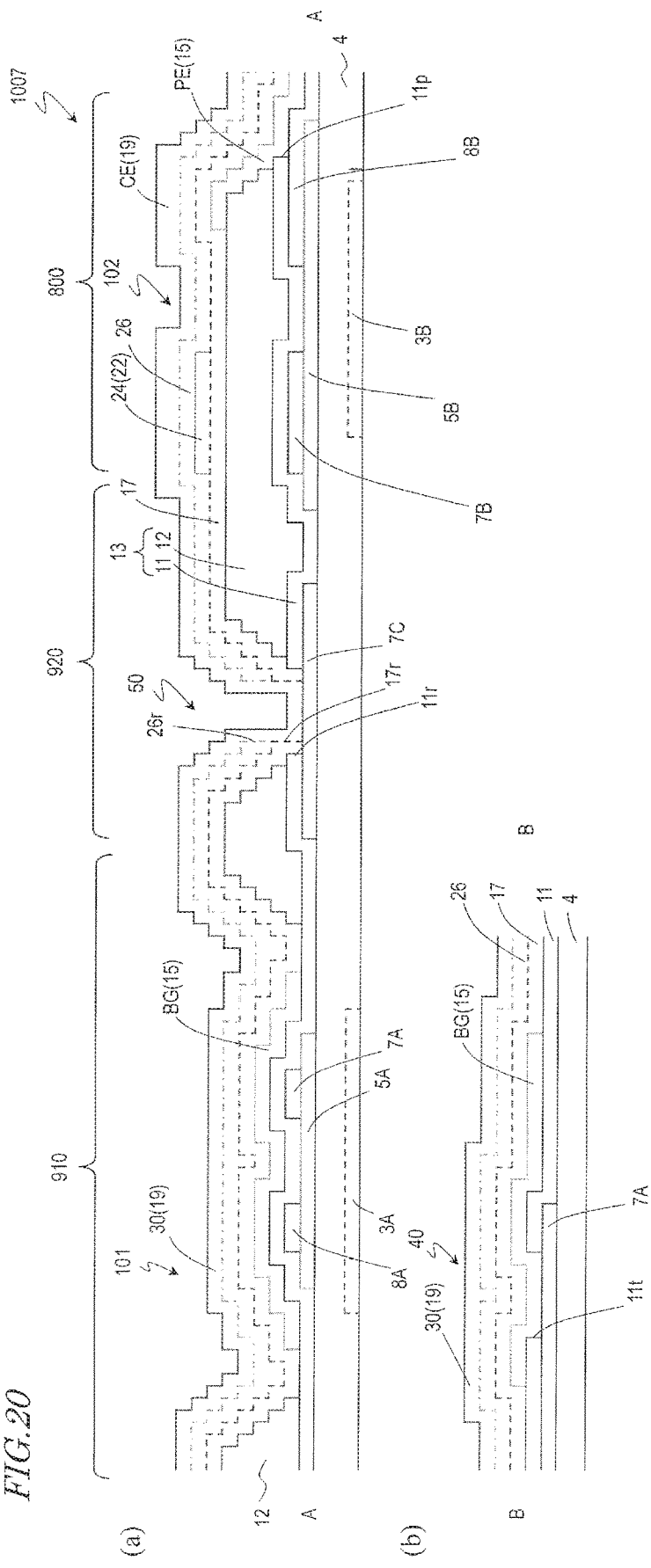
FIG. 20(a) and FIG. 20(b) are each a schematic cross-sectional view of the active matrix substrate 1007.

FIG. 19 is a schematic plan view showing another active matrix substrate 1007 according to this embodiment as an example. FIG. 20(a) and FIG. 20(b) are each a schematic cross-sectional view of the active matrix substrate 1007, and respectively show cross-sectional structures taken along lines A-A and B-B in FIG. 19.

In the active matrix substrate 1007, the line layer 22 and a third inorganic insulating layer 26 located on the line layer 22 are provided between the second inorganic insulating layer 17 and the second transparent electrode layer 19. The line layer 22 is, for example, a metal layer such as a Cu layer or the like.

In the display region 800, the line 24 formed in the line layer 22 is provided on the second inorganic insulating layer 17. The line 24 is located to overlap the source line as seen in the direction normal to the substrate. The third inorganic insulating layer 26 covers the line 24. Although not shown, a connection portion electrically connecting the line 24 and the common electrode CE on the third inorganic insulating layer 26 to each other is provided in, for example, each of the pixels.

In the COM line region 920, the common electrode CE is in contact with the COM line 7C in the COM contact hole formed in the third inorganic insulating layer 26, the second inorganic insulating layer 17 and the interlayer insulating layer 13. As seen in the direction normal to the substrate, the COM contact hole includes the opening 12R of the organic insulating layer 12, the opening 11r of the first inorganic insulating layer 11, and the opening 17r and an opening 26r of the second inorganic insulating layer 17 and the third inorganic insulating layer 26 that are located inside the openings 12R and 11r.

In the circuit region 910, the third inorganic insulating layer 26 extends to be located between the second inorganic insulating layer 17 and the shield layer 30. The rest of the structure is substantially the same as that of, for example, the active matrix substrate 1004 (FIG. 13 and FIG. 14).

In the active matrix substrate 1007, the third inorganic insulating layer 26, in addition to the second inorganic insulating layer 17, is located to cover the oxide semiconductor layer 5A. Therefore, the invasion of moisture into the oxide semiconductor layer 5A is suppressed more effectively.

The active matrix substrate 1007 is produced by substantially the same method as for the active matrix substrate 1004. It should be noted that the line 24 and the third inorganic insulating layer 26 are formed after the second inorganic insulating layer 17 is formed but before the second transparent electrode layer 19 is formed.

Specifically, after the second inorganic insulating layer 17 is formed to cover the first TFT 101, the second TFT 102 and the pixel electrode PE, the conductive film for the line is formed on the second inorganic insulating layer 17 and is patterned, so that the line 24 is obtained. The material of the conductive film for the line is substantially the same as described above. In this example, a Cu film is used.

Next, the third inorganic insulating layer 26 is formed on the second inorganic insulating layer 17 so as to cover the line 24. As the third inorganic insulating layer 26, an inorganic insulating film substantially the same as that of the second inorganic insulating layer 17 is usable. In this example, an SiN film is used as the third inorganic insulating layer 26. The third inorganic insulating layer 26 has a thickness of, for example, 70 nm or greater and 300 nm or less. In the active matrix substrate 1007, a stack film including the second inorganic insulating layer 17 and the third inorganic insulating layer 26 acts as a dielectric layer of a storage capacitance formed by the common electrode CE and the pixel electrode PE. From this point of view, a total thickness of the second inorganic insulating layer 17 and the third inorganic insulating layer 26 may be set to, for example, 140 nm or greater and 500 nm or less.

Next, the second inorganic insulating layer 17 and the third inorganic insulating layer 26 are etched at the same time, using the resist layer (not shown) as an etching mask. As a result, in the opening 12R, the opening 17r is formed in the second inorganic insulating layer 17 and the opening 26r is formed in the third inorganic insulating layer 26, so that the COM contact hole is obtained. In this example, side surfaces of the openings 17r and 26r are aligned to each other.

Next, the second transparent conductive film is formed on the third inorganic insulating layer 26 and in the COM contact hole and is patterned, so that the common electrode CE and the shield layer 30 are obtained. The shield layer 30 and the common electrode CE are formed integrally with each other, and contact the COM line 7C in the COM contact hole. In this manner, the active matrix substrate 1007 is produced.

Figure 21:
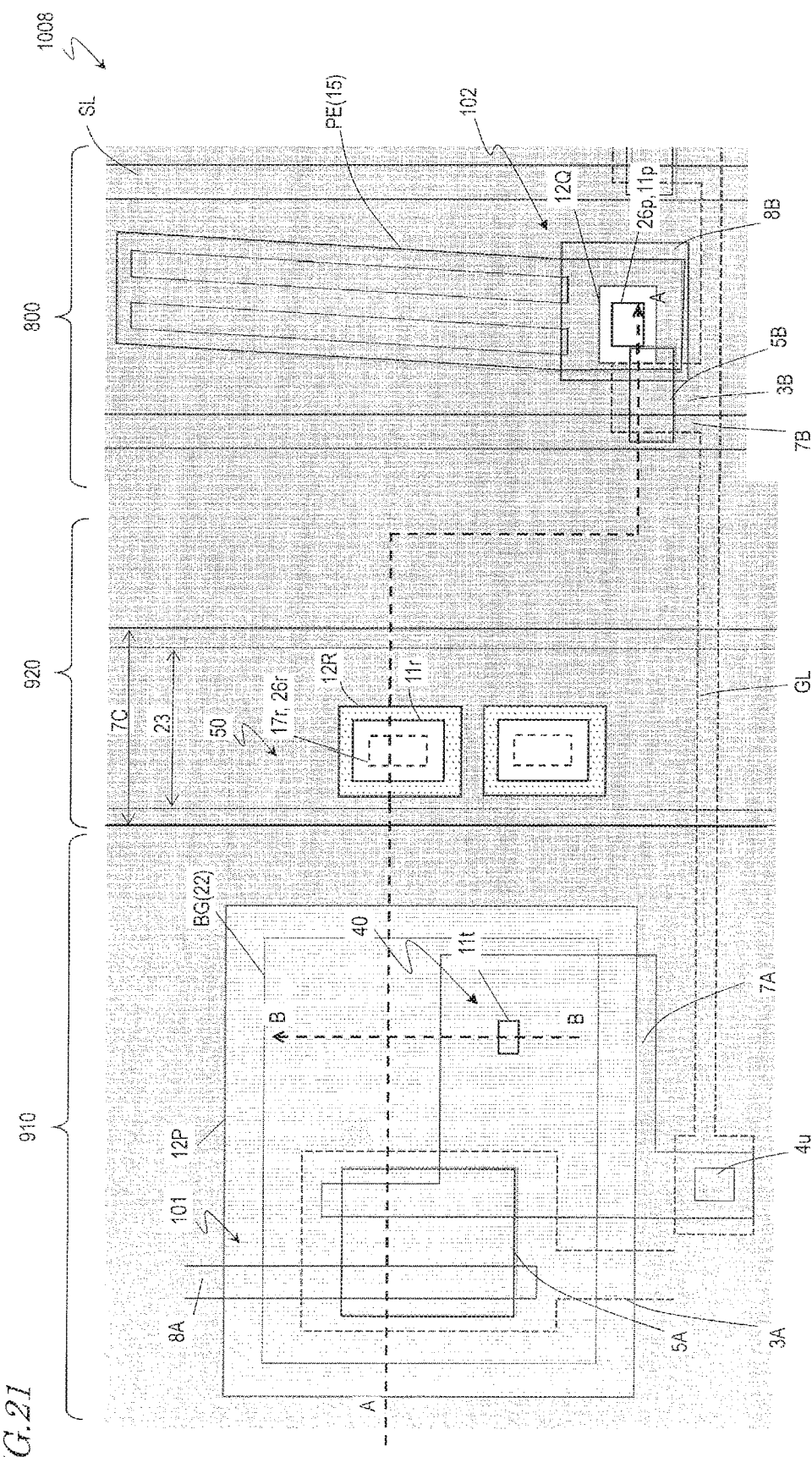
FIG. 21 is a schematic plan view showing still another active matrix substrate 1008 according to embodiment 4 as an example.
Figure 22:
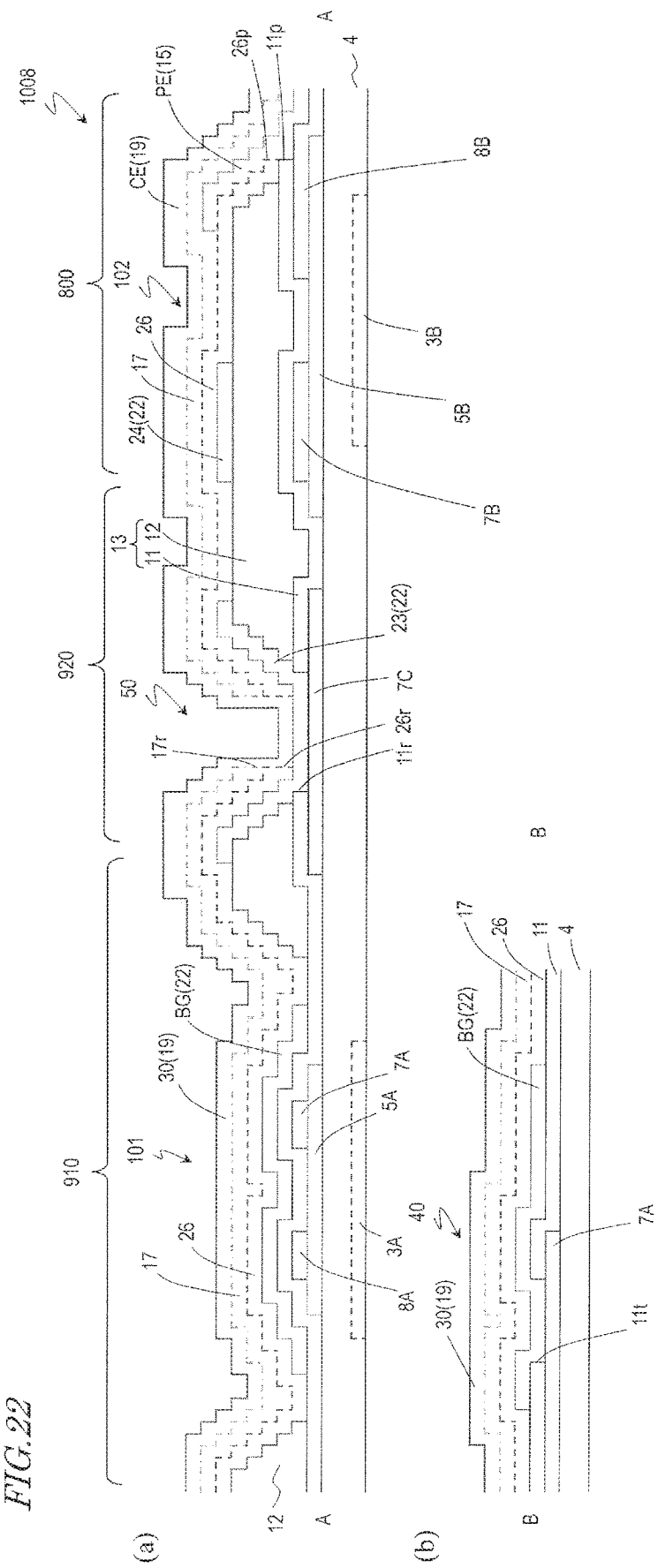
FIG. 22(a) and FIG. 22(b) are each a schematic cross-sectional view of the active matrix substrate 1008.

FIG. 21 is a schematic plan view showing a still another active matrix substrate 1008 according to this embodiment as an example. FIG. 22(a) and FIG. 22(b) are each a schematic cross-sectional view of the active matrix substrate 1008, and respectively show cross-sectional structures taken along lines A-A and B-B in FIG. 21.

In the active matrix substrate 1008, the line layer 22 and the third inorganic insulating layer 26 located on the line layer 22 are provided between the interlayer insulating layer 13 and the first transparent electrode layer 15. The line layer 22 is, for example, a metal layer such as a Cu layer or the like.

In the display region 800, the line 24 formed in the line layer 22 is provided on the interlayer insulating layer 13. The line 24 is located to overlap the source line as seen in the direction normal to the substrate. The third inorganic insulating layer 26 covers the line 24. On the third inorganic insulating layer 26, the pixel electrode PE, the second inorganic insulating layer 17 and the common electrode CE are provided in this order.

The pixel electrode PE is in contact with the drain electrode 8B in the pixel contact hole. The pixel contact hole includes the opening 12Q formed in the organic insulating layer 12 and the openings 26p and 11p formed in the third inorganic insulating layer 26 and the first inorganic insulating layer 11. As seen in the direction normal to the substrate, the openings 26p and 11p are aligned to each other, and are located inside the opening 12Q.

In the COM line region 920, the COM contact portion 50 includes a metal connection portion 23 formed of the same conductive film as that of the line 24 (namely, formed in the line layer 22). The common electrode CE is electrically connected with the COM line 7C via the metal connection portion 23. Specifically, the metal connection portion 23 is located in the openings 12R and 11r of the organic insulating layer 12 and the first inorganic insulating layer 11. The third inorganic insulating layer 26 and the second inorganic insulating layer 17 are provided on the metal connection portion 23, and have the openings 26r and 17r exposing a part of the metal connection portion 23. The common electrode CE is in contact with the metal connection portion 23 in the openings 26r and 17r. As seen in the direction normal to the substrate, the openings 26r and 17r are aligned to each other.

In the circuit region 910, the back-gate electrode BG is formed of the same conductive film as that of the line 24 (namely, formed in the line layer 22). The third inorganic insulating layer 26 and the second inorganic insulating layer 17 are formed between the back-gate electrode BG and the shield layer 30. The rest of the structure is substantially the same as that of, for example, the active matrix substrate 1004 (FIG. 13 and FIG. 14).

In the active matrix substrate 1008, the third inorganic insulating layer 26, in addition to the second inorganic insulating layer 17, is located to cover the oxide semiconductor layer 5A. In addition, a metal electrode is allowed to be formed as the back-gate electrode BG. Therefore, the invasion of moisture into the oxide semiconductor layer 5A is suppressed more effectively, and the electrical resistance of the back-gate electrode BG is decreased.

The active matrix substrate 1008 is produced by substantially the same method as for the active matrix substrate 1004. It should be noted that the line layer 22 and the third inorganic insulating layer 26 are formed after the interlayer insulating layer 13 is formed but before the first transparent electrode layer 15 is formed.

Specifically, after the interlayer insulating layer 13 is formed, the first inorganic insulating layer 11 is etched, using the resist layer (not shown) and the organic insulating layer 12 as an etching mask. As a result, in the COM line region 920, the opening 11r is formed in the first inorganic insulating layer 11 in the opening 12R. In the circuit region 910, the opening 11t is formed in the first inorganic insulating layer 11 in the opening 12P, so that the back-gate contact hole is obtained.

Next, the conductive film for the line is formed on the interlayer insulating layer 13 and in the openings, and is patterned. The material of the conductive film for the line is substantially the same as described above. In this example, a Cu film is used. As a result, the line layer 22 including the line 24, the metal connection portion 23 and the back-gate electrode BG is obtained. The metal connection portion 23 is located to contact the COM line 7C in the COM contact hole. The position of the back-gate electrode BG is substantially the same as in the active matrix substrate 1004, and the position of the line 24 is substantially the same as in the active matrix substrate 1007.

Next, the third inorganic insulating layer 26 is formed to cover the line layer 22. The material and the thickness of the third inorganic insulating layer 26 are substantially the same as the material and the thickness described above. In this example, an SiN film is used. Next, the third inorganic insulating layer 26 and the first inorganic insulating layer 11 are etched at the same time, using the resist layer (not shown). As a result, in the opening 12Q, the openings 26p and 11p are formed in the third inorganic insulating layer 26 and the first inorganic insulating layer 11, so that the pixel contact hole exposing the drain electrode 8B is obtained.

Next, the first transparent conductive film is formed on the second inorganic insulating layer 17 and in the pixel contact hole and is patterned, so that the first transparent electrode layer 15 including the pixel electrode PE is formed.

Next, the second inorganic insulating layer 17 is formed on the pixel electrode PE and the third inorganic insulating layer 26. Then, the second inorganic insulating layer 17 and the third inorganic insulating layer 26 are etched at the same time, using the resist layer (not shown) as an etching mask. As a result, in the opening 12R, the opening 17r is formed in the inorganic insulating layer 17 and the opening 26r is formed in the third inorganic insulating layer 26, so that the COM contact hole exposing the metal connection portion 23 is obtained.

Next, the second transparent conductive film is formed on the third inorganic insulating layer 26 and in the COM contact hole and is patterned, so that the second transparent electrode layer 19 including the common electrode CE and the shield layer 30 is obtained. In this manner, the active matrix substrate 1008 is produced.

(Structure of the Peripheral Circuit)

In this embodiment, the peripheral circuit including the first TFT 101 is, for example, a gate driver. The gate driver includes a shift register including a plurality of stages.

Figure 23:
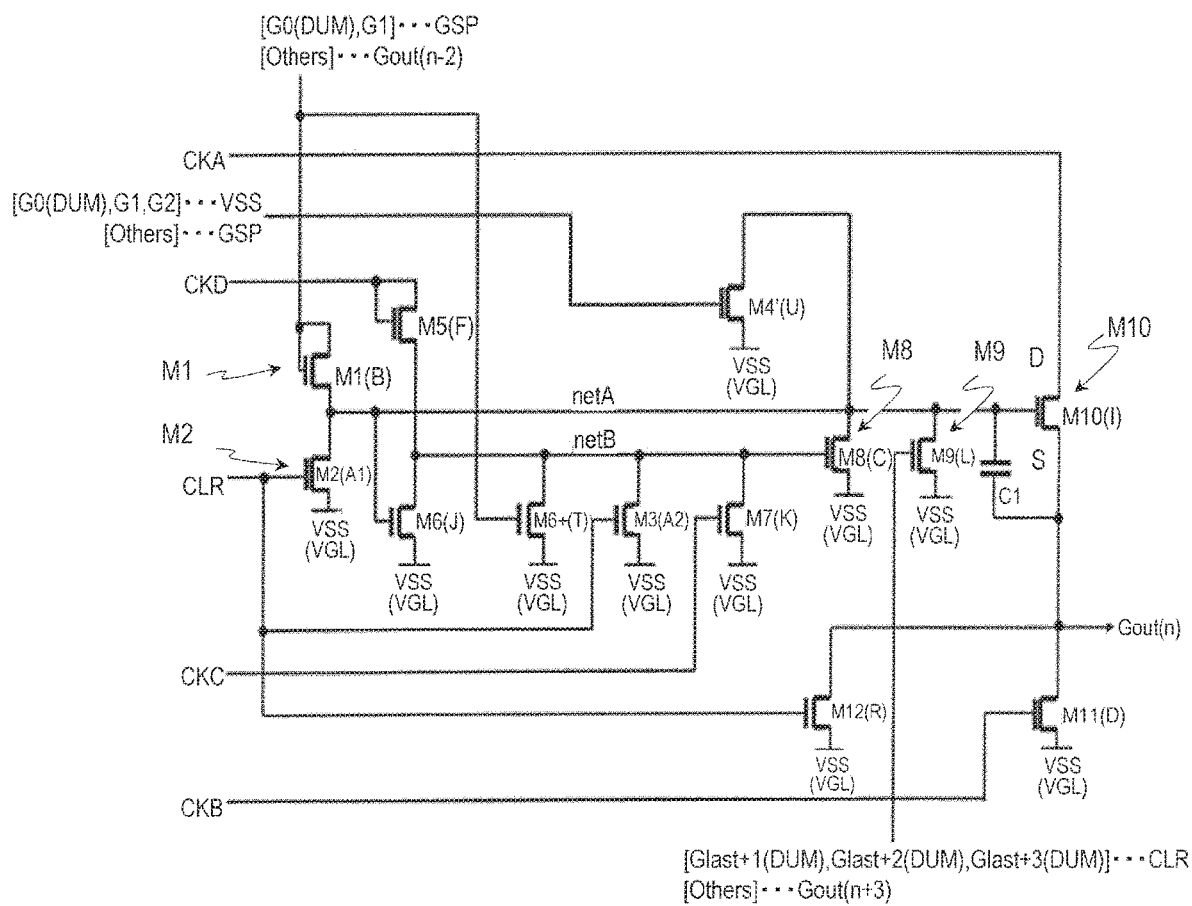
FIG. 23 shows as example of circuit configuration of a shift register.
Figure 24:
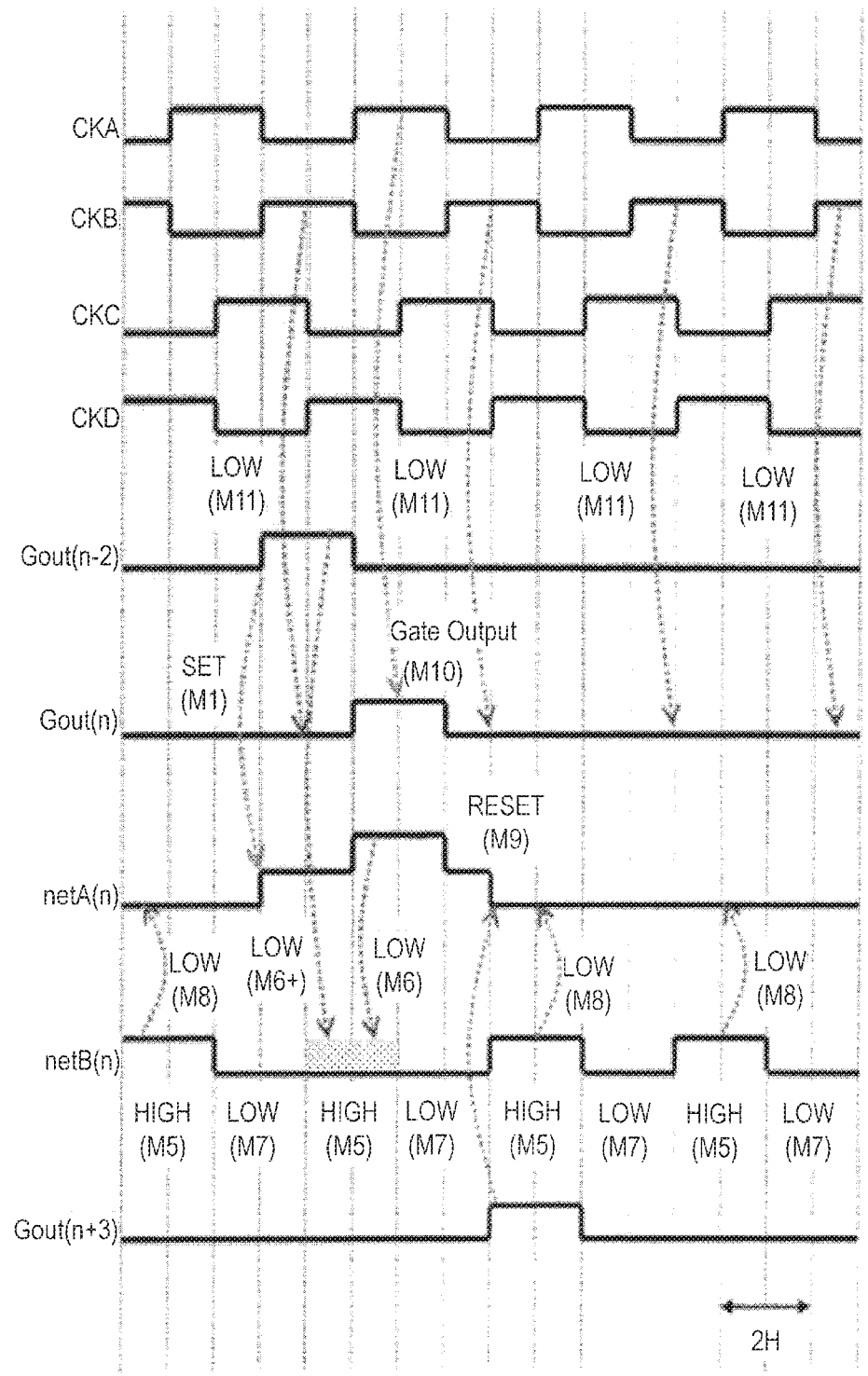
FIG. 24 shows waveforms of input/output signals and voltage waveforms of netA and netB of each stage of the shift register shown in FIG. 23.

FIG. 23 shows an example of circuit configuration of the shift register. FIG. 24 shows waveforms of input/output signals of and waveforms of voltages of netA and netB of each of the stages of the shift register. The structure and the operation of the shift register shown in FIG. 23 and FIG. 24 are disclosed in, for example, WO2013/137069 of the application filed by the present applicant and Japanese Laid-Open Patent Publication No. 2010-192019 of the application filed by the present applicant, and will not be described herein. The entirety of the disclosures of the above-mentioned patent documents is incorporated herein by reference.

Each stage of the shift register includes an input terminal receiving a gate start pulse GSP or an output signal Gout (n−2) from the immediately previous stage of the shift register, an output terminal outputting an output signal Gout(n), and terminals respectively receiving a plurality of clock signals CKA, CKB, CKC and CED having different phases from each other. One of the output terminals is connected with a corresponding gate bus line, and another one of the output terminals is connected with an input terminal of the shift register of the immediately subsequent stage.

As shown in FIG. 23, each stage of the shift register includes a first transistor (also referred to as an "output transistor") M10 outputting the output signal Gout(n), and a plurality of second transistors M1, M2, M8 and M9 each having a source or a drain electrically connected with a gate (main gate electrode) of the transistor M10. The first transistor M10 is a so-called pull-up transistor, and a line connected with the main gate electrode of the first transistor M10 is referred to as "netA". One of the source and the drain of each of the second transistors M, M2, M8 and M9 is connected with netA, and the other of the source and the drain is connected with a Low potential (negative-side power supply VSS or Gout).

In this embodiment, in the above-described shift register, one or a plurality of transistors among the first transistor and the second transistors adopts a back-gate structure.

In the case where the back-gate structure is applied to the first transistor (output transistor) 110, the back-gate electrode may be electrically connected with, for example, the source or the drain of the first transistor (in this example, the source (S-side line in the figure)). Alternatively, the back-gate electrode may be independently connected with another power supply. In the case where the back-gate structure is applied to the second transistors M1, 112, M8 or M9, the back-gate electrode may be set to have a negative-side power supply potential VSS or may be independently connected with another power supply.

The back-gate structure may be applied to a transistor other than the first and the second transistors. The back-gate electrode of such a transistor may be connected with another power supply.

<TFT Structure and Oxide Semiconductor>

The first TFT 101 and the second TFT 102 in each of the above-described embodiments may each be a channel-etch TFT. In a channel-etch TFT, no etch-stop layer is formed on the channel region, and a bottom surface of a channel-side end portion of each of the source and drain electrodes is located to contact a top surface of the oxide semiconductor layer (see FIG. 9). Such a channel-etch TFT is formed by, for example, forming a conductive film for the source and drain electrodes on the oxide semiconductor layer and separating the source and the drain from each other. There may be a case where in such a source/drain separation step, a surface of the channel region is etched. The first TFT 101 and the second TFT 102 may each be an etch-stop TFT (see FIG. 12). In an etch-stop TFT, a protective layer (etch-stop layer) is formed on the channel region. A bottom surface of a channel-side end portion of each of the source and drain electrodes is located on, for example, the etch-stop layer. Such an etch-stop TFT is formed by, for example, forming an etch-stop layer covering a portion of the oxide semiconductor layer that is to be a channel region, then forming a conductive film for the source and drain electrodes on the oxide semiconductor layer and the etch-stop layer, and separating the source and the drain from each other.

In each of the above-described embodiments, the oxide semiconductor contained in the oxide semiconductor layers 5A and 5B may be an amorphous oxide semiconductor or a crystalline oxide semiconductor including a crystalline portion. Examples of the crystalline oxide semiconductor include a polycrystalline oxide semiconductor, a microcrystalline oxide semiconductor, a crystalline oxide semiconductor having a c axis aligned generally perpendicular to a layer surface, and the like.

The oxide semiconductor layers 5A and 5B may each have a stack structure including two or more layers. In the case of having the stack structure, the oxide semiconductor layers 5A and 5B may each include a non-crystalline oxide semiconductor layer and a crystalline oxide semiconductor layer. Alternatively, the oxide semiconductor layers 5A and 5B may each include a plurality of crystalline oxide semiconductor layers having different crystalline structures. Still alternatively, the oxide semiconductor layers 5A and 5B may each include a plurality of non-crystalline oxide semiconductor layers. In the case where the oxide semiconductor layers 5A and 5B each have a two-layer structure including an upper layer and a lower layer, it is preferred that the energy gap of the oxide semiconductor contained in the upper layer is larger than the energy gap of the oxide semiconductor contained in the lower layer. It should be noted that the energy gap of the oxide semiconductor contained in the lower layer may be larger than the energy gap of the oxide semiconductor contained in the upper layer as long as the energy gap difference between these layers is relatively small.

The material, structure, and film formation method of the non-crystalline oxide semiconductor and the above-described types of crystalline oxide semiconductors, the structure of the oxide semiconductor layers having a stack structure, and the like are described in, for example, Japanese Laid-Open Patent Publication No. 2014-003799. The entirety of the disclosure of Japanese Laid-Open Patent Publication No. 2014-003799 is incorporated herein by reference.

The oxide semiconductor layers 5A and 5B may each contain, for example, at least one metal element among In, Ga and Zn. In this embodiment, the oxide semiconductor layers 5A and 5B each contain, for example, an In—Ga—Zn—O-based semiconductor (e.g., indium gallium zinc oxide). The In—Ga—Zn—O-based semiconductor is a three-component oxide of In (indium), Ga (gallium) and Zn (zinc). There is no specific limitation on the ratio (composition ratio) among In, Ga and Zn. The ratio may be, for example, In:Ga:Zn=2:2:1, In:Ga:Zn=1:1:1, In:Ga:Zn=1:1:2, or the like. The oxide semiconductor layers 5A and 5B may each be formed of an oxide semiconductor film containing an In—Ga—Zn—O-based semiconductor.

The In—Ga—Zn—O-based semiconductor may be amorphous or crystalline. A preferred crystalline In—Ga—Zn—O-based semiconductor is a crystalline In—Ga—Zn—O-based semiconductor having a c axis aligned generally perpendicular to a layer surface.

The crystalline structure of the crystalline In—Ga—Zn—O-based semiconductor is disclosed in, for example, Japanese Laid-Open Patent Publication No. 2014-007399 mentioned above, Japanese Laid-Open Patent Publication No. 2012-134475, Japanese Laid-Open Patent Publication No. 2014-209727 and the like. The entirety of the disclosures of Japanese Laid-Open Patent Publication No. 2012-134475 and Japanese Laid-Open Patent Publication No. 2014-209727 is incorporated herein by reference. A TFT including an In—Ga—Zn—O-based semiconductor layer has a high mobility (20 times the mobility of a-SiTFT) and a low leak current (less than 1/100 of the leak current of a-SiTFT). Therefore, such a TFT is preferably usable as a driving TFT (e.g., TFT included in a driving circuit provided in the vicinity of a display region including a plurality of pixels, on the same substrate as the display region) or a pixel TFT (TFT provided in a pixel).

The oxide semiconductor layers 5A and 5B may each contain another oxide semiconductor instead of the In—Ga—Zn—O-based semiconductor. The oxide semiconductor layers 5A and 5B may each contain, for example, an In—Sn—Zn—O-based semiconductor (e.g., $In_2O_3$—$SnO_2$—ZnO; InSnZnO). The In—Sn—Zn—O-based semiconductor is a three-component oxide of In (indium), Sn (tin) and Zn (zinc). Alternatively, the oxide semiconductor layers 5A and 5B may each contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, or the like.

INDUSTRIAL APPLICABILITY

The embodiments of the present invention are applicable to an oxide semiconductor TFT and any of various types of active matrix substrates including an oxide semiconductor TFT. The embodiments of the present invention are especially preferably applicable to an active matrix substrate including two transparent electrode layers facing each other while having an insulating layer therebetween. An active matrix substrate according to each of these embodiments is preferably usable for a liquid crystal display apparatus, for example, a liquid crystal display apparatus providing display in a transverse electric field mode such as an FFS mode or the like. An active matrix substrate according to each of these embodiments is also applicable to a display device such as an organic electroluminescence (EL) display device, an inorganic electroluminescence display device or the like, an image capturing device such as an image sensor device or the like, an image input device, a fingerprint reading device, and any of various electronic devices such as a semiconductor memory or the like.

REFERENCE SIGNS LIST 1 substrate
3A, 3B gate electrode
4 gate insulating layer
5A, 5B oxide semiconductor layer
7A, 7B source electrode
8A, 8B drain electrode
9 protective layer (etch-stop layer)
11 first inorganic insulating layer
12 organic insulating layer
12P, 12Q, 12R opening
13 interlayer insulating layer
15 first transparent electrode layer
17 second inorganic insulating layer
19 second transparent electrode layer
30 shield layer (transparent conductive layer)
101 first TFT (circuit TFT having a back-gate structure)
102 second TFT (pixel TFT)
800 display region
900 non-display region
910 circuit region
920 COM line region
1001, 1002, 1003, 1004, 1005, 1006, 1007, 1008 active matrix substrate
BG back-gate electrode
CE common electrode
PE pixel electrode
GL gate line
SL source line
7C COM line

The invention claimed is:

1. An active matrix substrate including a display region including a plurality of pixels and a non-display region around the display region, the active matrix substrate comprising:
   a substrate;
   a first oxide semiconductor thin-film transistor (TFT) supported by the substrate and in the non-display region;
   a peripheral circuit including the first oxide semiconductor TFT;
   a plurality of second oxide semiconductor TFTs supported by the substrate and in the display region; and
   a first inorganic insulating layer covering the plurality of second oxide semiconductor TFTs, wherein
   the first oxide semiconductor TFT includes:
      a lower gate electrode,
      a gate insulating layer covering the lower gate electrode,
      an oxide semiconductor layer opposing the lower gate electrode with the gate insulating layer being between the oxide semiconductor layer and the lower gate electrode,
      a source electrode and a drain electrode each connected with the oxide semiconductor layer, and
      an upper gate electrode on the oxide semiconductor layer with an insulating layer including the first inorganic insulating layer being between the upper gate electrode and the oxide semiconductor layer,
   the active matrix substrate further includes a second inorganic insulating layer on the upper gate electrode, the second inorganic insulating layer covering the first oxide semiconductor TFT,
   the active matrix substrate further includes an organic insulating layer between the first inorganic insulating layer and the second inorganic insulating layer in the display region and in the non-display region, the organic insulating layer covering at least a portion of the second oxide semiconductor TFT in the display region and covering at least a portion of the peripheral circuit in the non-display region,
   the organic insulating layer includes a through opening overlapping at least a portion of the oxide semiconductor layer of the first oxide semiconductor TFT as viewed from a direction normal to the substrate, and
   at least a portion of the upper gate electrode is in the through opening of the organic insulating layer and surrounded by a side wall of the through opening of the organic insulating layer as viewed from the direction normal to the substrate.

2. The active matrix substrate of claim 1, further comprising a transparent conductive layer located on the second inorganic insulating layer so as to overlap the upper gate electrode with the second inorganic insulating layer being located between the transparent conductive layer and the upper gate electrode.

3. The active matrix substrate of claim 2, wherein the transparent conductive layer covers at least a part of the peripheral circuit.

4. The active matrix substrate of claim 2, further comprising:
   a lower transparent electrode provided on the first inorganic insulating layer in the display region, and
   an upper transparent electrode located on the lower transparent electrode with the second inorganic insulating layer being located between the upper transparent electrode and the lower transparent electrode,
   wherein the upper gate electrode is formed of a same transparent conductive film as the lower transparent electrode, and
   wherein the transparent conductive layer is formed of a same transparent conductive film as the upper transparent electrode.

5. The active matrix substrate of claim 4, wherein one of the lower transparent electrode and the upper transparent electrode is a pixel electrode, and the other of the lower transparent electrode and the upper transparent electrode is a common electrode.

6. The active matrix substrate of claim 5, wherein the transparent conductive layer is electrically connected with the common electrode.

7. The active matrix substrate of claim 5, further comprising an upper gate contact portion electrically connecting the upper gate electrode and the common electrode to each other.

8. The active matrix substrate of claim 4, further comprising:
   an upper gate contact portion electrically connecting the upper gate electrode and the source electrode of the first oxide semiconductor TFT to each other, and
   a connection portion made of the same transparent conductive film as the upper transparent electrode,
   wherein in the upper gate contact portion, the upper gate electrode and the source electrode are connected to each other via the connection portion.

9. The active matrix substrate of claim 2, further comprising:
   a lower transparent electrode provided on the first inorganic insulating layer in the display region,
   an upper transparent electrode located on the lower transparent electrode with the second inorganic insulating layer being located between the upper transparent electrode and the lower transparent electrode, and
   another line located between the first inorganic insulating layer and the upper transparent electrode, wherein
   one of the lower transparent electrode and the upper transparent electrode is a pixel electrode, the other of the lower transparent electrode and the upper transparent electrode is a common electrode, and the another line is not electrically connected with the pixel electrode or the common electrode.

10. The active matrix substrate of claim 9, wherein the upper gate electrode is formed of a same conductive film as the another line.

11. The active matrix substrate of claim 9, wherein the upper gate electrode has a stack structure including a lower layer formed of a same transparent conductive film as the lower transparent electrode and an upper layer formed of a same conductive film as the another line.

12. The active matrix substrate of claim 9, further comprising a third inorganic insulating layer provided on the upper gate electrode, the third inorganic insulating layer covering the first oxide semiconductor TFT.

13. The active matrix substrate of claim 2, wherein as viewed from the direction normal to the substrate, an outer edge of the upper gate electrode is located inside an outer edge of the transparent conductive layer, and a distance between the outer edge of the upper gate electrode and the outer edge of the transparent conductive layer is 1 μm or longer.

14. The active matrix substrate of claim 2, wherein the transparent conductive layer extends to cover the side wall of the through opening of the organic insulating layer.

15. The active matrix substrate of claim 1, further comprising an upper gate contact portion electrically connecting the upper gate electrode and the source electrode or the drain electrode of the first oxide semiconductor TFT to each other.

16. The active matrix substrate of claim 1, further comprising an upper gate contact portion electrically connecting the upper gate electrode and the lower gate electrode to each other.

17. The active matrix substrate of claim 1, wherein as viewed from the direction normal to the substrate, an outer edge of the oxide semiconductor layer is located inside an outer edge of the upper gate electrode, and a distance between the outer edge of the oxide semiconductor layer and the outer edge of the upper gate electrode is 1 ⌑ m or longer.

18. The active matrix substrate of claim 1, wherein the first oxide semiconductor TFT and the plurality of second oxide semiconductor TFTs are each a channel-etch TFT.

19. The active matrix substrate of claim 1, wherein the oxide semiconductor layer contains an In—Ga—Zn—O-based semiconductor.

20. The active matrix substrate of claim 19, wherein the In—Ga—Zn—O-based semiconductor includes a crystalline portion.

21. The active matrix substrate of claim 1, wherein the second inorganic insulating layer is in contact with the upper gate electrode.

22. The active matrix substrate of claim 1, further comprising an upper gate contact portion electrically connecting the upper gate electrode to another electrode, the upper gate contact portion is in the through opening of the organic insulating layer and surrounded by the side wall of the through opening of the organic insulating layer as viewed from the direction normal to the substrate.

23. An active matrix substrate including a display region including a plurality of pixels and a non-display region around the display region, the active matrix substrate comprising:
a substrate;
a first oxide semiconductor thin-film transistor (TFT) supported by the substrate and in the non-display region;
a peripheral circuit including the first oxide semiconductor TFT;
a plurality of second oxide semiconductor TFTs supported by the substrate and in the display region; and
a first inorganic insulating layer covering the plurality of second oxide semiconductor TFTs, wherein
the first oxide semiconductor TFT includes:
a lower gate electrode,
a gate insulating layer covering the lower gate electrode,
an oxide semiconductor layer opposing the lower gate electrode with the gate insulating layer being between the oxide semiconductor layer and the lower gate electrode,
a source electrode and a drain electrode each connected with the oxide semiconductor layer, and
an upper gate electrode on the oxide semiconductor layer with an insulating layer including the first inorganic insulating layer being between the upper gate electrode and the oxide semiconductor layer,
the active matrix substrate further includes:
a second inorganic insulating layer on the upper gate electrode, the second inorganic insulating layer covering the first oxide semiconductor TFT,
a transparent conductive layer on the second inorganic insulating layer to overlap the upper gate electrode with the second inorganic insulating layer being between the transparent conductive layer and the upper gate electrode,
a lower transparent electrode on the first inorganic insulating layer in the display region, and
an upper transparent electrode on the lower transparent electrode with the second inorganic insulating layer being between the upper transparent electrode and the lower transparent electrode,
the upper gate electrode is made of a same transparent conductive film as the lower transparent electrode, and
the transparent conductive layer is made of a same transparent conductive film as the upper transparent electrode,
the active matrix substrate further includes:
an upper gate contact portion electrically connecting the upper gate electrode and the source electrode of the first oxide semiconductor TFT to each other, and
a connection portion made of the same transparent conductive film as the upper transparent electrode, and
in the upper gate contact portion, the upper gate electrode and the source electrode are connected to each other via the connection portion.

* * * * *